United States Patent [19]

Hunt et al.

[11] Patent Number: 5,044,875
[45] Date of Patent: Sep. 3, 1991

[54] METHOD AND APPARATUS FOR POSITIONING COMPONENTS

[75] Inventors: Ronald E. Hunt, Georgetown; Verlon E. Whitehead, Austin, both of Tex.

[73] Assignee: International Business Machines Corporation, Armonk, N.Y.

[21] Appl. No.: 353,299

[22] Filed: May 17, 1989

Related U.S. Application Data

[63] Continuation-in-part of Ser. No. 155,945, Feb. 16, 1988, abandoned.

[51] Int. Cl.$^5$ .................. B65G 59/06; B23P 19/00
[52] U.S. Cl. .................. 414/797.9; 414/795.7; 29/740; 29/834; 221/211; 221/238; 221/287
[58] Field of Search .............. 221/211, 233, 236, 238, 221/262, 268, 270, 287; 29/740, 759, 840, 834; 414/795.7, 797.4, 797.9

[56] References Cited

U.S. PATENT DOCUMENTS

| | | | |
|---|---|---|---|
| 4,046,370 | 9/1977 | Navi | 271/3.1 |
| 4,222,166 | 9/1980 | Kurek et al. | 29/831 |
| 4,389,272 | 6/1983 | Ferri et al. | 29/809 |
| 4,393,579 | 7/1983 | Van Hooreweder | 29/809 |
| 4,543,713 | 10/1985 | Rapp | 29/837 |
| 4,740,136 | 4/1988 | Asai et al. | 29/740 |

Primary Examiner—Robert P. Olszewski
Assistant Examiner—Steve Reim
Attorney, Agent, or Firm—Robert M. Carwell; Mark E. McBurney

[57] ABSTRACT

A method and apparatus are provided for simultaneously positioning electronic components, such as surface-mounted chips on a circuit board. A removable load plate carries a plurality of chip placement assemblies, each having a support disposing a plurality of such components in a stack adjacent the board. The assemblies are disposed about the load plate in a geometric pattern corresponding to that of chips to be placed. A stripping component of each assembly in slidable engagement with the support sequentially urges each chip in the stack transversely from the stack to a second position opposing a corresponding desired site on the board where the chip is to be placed. Each support includes a mounting block having a connector for releasable interconnection of each positioning apparatus to the load plate. A chamber maintains the chip at the second position in response to fluid pressure differential. The support receives a tube for transporting the chip from the second position to a third position wherein it engages the board site. A shuttle plate simultaneously urges the stripping components of all assemblies in the slidable motion to strip chips from the stack. The load plate is easily replaced with one re-loaded off line to carry a replenished supply of chips in the same or different pattern.

24 Claims, 25 Drawing Sheets

LOAD POSITION

CHIP PICKUP

CHIP DELIVERY

METHOD AND APPARATUS FOR POSITIONING COMPONENTS

RELATED CASES

This is a continuation-in-part of U.S. patent application, Ser. No. 07/155,945, filed Feb. 16, 1988, entitled "Method and Apparatus for Positioning Components" now abandoned.

TECHNICAL FIELD

This invention relates to systems and methods for automatically placing electronic components on circuit boards, and, more particularly, to methods and apparatus for sequentially positioning chip components adjacent corresponding sites on the board for subsequent placement thereon.

BACKGROUND ART

Due to many factors including the high cost of labor associated with populating circuit boards with components, technology in the electronic manufacturing arts has development to automatically place such components on boards. A representative system is seen depicted in U.S. Pat. No. 4,202,092. Tapes or magazines carry a plurality of components each of which is sequentially withdrawn from the tape or magazine. The pins thereof are then automatically inserted in corresponding holes in the board by means of a relatively complex mechanical robot arm linkage associated with each component type. Such systems are deficient in many respects. First, mechanisms were required to sever each component from the tape and bend leads for registration in the holes. Moreover, a complex mechanical linkage was required for each such component type as well as a corresponding relatively long travel path of the component from the tape or magazine to the location on the board. However, due to relatively small component densities, pin-in-hole tolerances initially in the development of the art were not so critical as to require more precise component placement.

Yet another example of the aforementioned art may be seen in U.S. Pat. No. 4,543,713 wherein there is disclosed yet another automated technique for installing components on a circuit board. A magazine containing a plurality of the leaded components is provided. In like manner to the hereinbefore noted reference, a relatively complex and large mechanical system is required for sequentially placing the components on the board. The system is primarily applicable to relatively large leaded components. Moreover due to the aforementioned relative complexity of the mechanical system involved, the number of systems and thus components which may be simultaneously placed on a single board is accordingly limited.

In U.S Pat. No. 4,222,166 disclosed therein is a system which seeks to alleviate some of the aforementioned problems. A plurality of pinned components are positioned proximate their appropriate positions on the board for subsequent manual insertion. A somewhat less complex mechanism is thereby provided so as to facilitate positioning of the components. The system nevertheless requires a manual step. Each component is sequentially withdrawn from its correlative magazine followed by manual insertion of the leads thereof in corresponding holes disposed through the board. Moreover, notwithstanding simplification of the mechanical system relative to the previously described references, the mechanisms were nevertheless still relatively complex and bulky.

In U.S. Pat. No. 4,528,747, a system is disclosed wherein sequential manual insertion of pins is sought to be avoided. A template is provided having a plurality of apertures for matingly receiving a corresponding plurality of desired components, although the reference provides little information as to how these components are loaded from corresponding magazines into the apertures. The template carrying the components is thence positioned over the circuit board by a robotic arm. By means of vibration, the pins of the various components are disposed through the appropriate holes. Not only does such a system require again a relatively complex mechanical system in the form of a robotic arm to position the components adjacent the desired sites on the circuit boards, but no details are disclosed for conveying the components from their respective magazines to their apertures in the template.

U.S. Pat. No. 4,300,715 reflects a move in the art to leadless components to avoid the aforementioned problems in placement of pinned or leaded components through circuit board holes. Component chips disposed on tape such as that used in the prior references to carry leaded components are removed from the tape sequentially by a complex robot gripper mechanism and deposited at the desired location on a substrate. In U.S. Pat. No. 4,342,090 there is disclosed a system for simultaneously positioning a plurality of chips onto corresponding sites. The chips are simultaneously withdrawn from their corresponding magazines and transported by means of a vacuum pencil pickup assembly travelling upwards, laterally, and thence downwards so as to deposit the chips on their respective sites.

In U.S. Pat. No. 4,451,324, yet another system is disclosed for depositing a plurality of chip type circuit elements on a board. A plurality of pipes are provided each of which extends to a supply of circuit components. The components travel through their respective supplies in an end-on-end fashion until they are deposited by the pipes at corresponding desired preselected locations on the circuit board. Elaborate boots and shuttle plate means are provided for thence rotating the components into horizontal alignment at desired orientations on a template whereupon the template thence deposits the various components simultaneously on the board in the desired alignment. There is no detailed disclosure of the means by which the components associated with each tube are individually disposed within each tube from the corresponding component supplies. Although a system is nevertheless disclosed for simultaneous chip placement, once again the mechanism in its entirety for positioning a plurality of chips adjacent corresponding circuit board sites is quite complex.

In a move to simplify the simultaneous positioning of chips adjacent correlative sites of a circuit board, a system is provided by Panasonic National, details of a representative system thereof being set forth in a publication entitled "Specifications: Panasert Simultaneous Chip Component Placement Machine Model No. NM-8270". With regard to such disclosure and specifically with respect to the details thereof set forth on page 8, a plurality of sticks each carrying stacked chip components therein may be loaded directly onto corresponding placement stations within the machine. The circuit board to be populated is thence positioned over the plurality of component sticks. The sticks are arranged in a horizontal pattern corresponding to the horizontal pattern of sites on the underneath side of the board at which the components are desirably to be placed. The underneath side of the board is coated with an adhesive. Upon upward urging of the stacks of components within their corresponding sticks by means of pushing pins or the like, the topmost components of the sticks are thereby urged against the adhesive on the board at the corresponding locations thereon where the components are desired to be placed. The thus-populated board is then replaced with the next board and the process repeated, resulting in simultaneous multiple chip component placement.

While the aforementioned system does eliminate problems associated with robotic arms, relatively complex travel paths of the circuit components from the magazines or tapes to the circuit board sites, and the like, several serious problems are nevertheless associated with this system. Notable among these are the tendency which components have to stick together when withdrawn vertically from the sticks caused by static, dust, dirt, adhesive or other particulate matter present on the components and adjacent thereto. Problems associated with this failure of components to uniformly exit the stick and be deposited on the board include jamming of the system and incorrect orientation of the uppermost chips in the stick after deposition on the board in undesired orientations (as, for example, when the chip may be turned so as to rest vertically on its edge rather than presenting a substantially horizontal planar surface to be impressed into the adhesive coating). This, in turn results, in unacceptable rejection rates for the populated boards. However, yet a further shortcoming of the apparatus was failure to provide a simple means for identifying the precise location of the jam or other malfunction as well as a means for preventing or minimizing the damage to the apparatus resulting from such malfunction.

In U.S. Pat. No. 4,393,579 still another system is disclosed for placing chips one at a time sequentially on a board. While the placement is from the top of the board and includes a shuttling mechanism for stripping single components from a magazine, and thence supporting and placing them by means of a vacuum support, the apparatus is extremely complicated and does not even remotely suggest replication of the entire apparatus many times over to effect simultaneous placement of a plurality of chips as in the case of the subject invention. Specifically, the apparatus calls for the mounting head to be secured on a table by means of a side wall so as to be adjustable in the X-Y direction. In this manner, a sequence of components may be placed on a given substrate one at a time by relocating the X-Y position of the placement head each time a next chip is sequentially placed on the substrate. This in turn gives rise to added cost and complexity in providing such mechanically orienting linkages as well as associated notorious inaccuracies with such systems and the inherent serious drawbacks of single chip placement.

Accordingly, a chip positioning apparatus adapted for simultaneous multi-component placement was desired which was of a small, simple, inexpensive and reliable construction for populating high circuit density boards. Such apparatus was further desired which also facilitated rapid off-line replenishment of chip supplies and ease of varying chip placement patterns to accommodate different product circuit boards and to minimize placement machine downtime.

DISCLOSURE OF THE INVENTION

Method and apparatus for positioning electronic components, such as surface-mounted chips, for subsequent placement on a circuit board.

Support means disposes a plurality of such components in a stack adjacent the board. Stripping means in slidable engagement with the support means sequentially urges each chip in the stack transversely of the stack from a first position therein to a second position opposing a corresponding desired site on the board where the chip is to be placed.

The support means includes a mounting block having connector means for releasable interconnection of the positioning apparatus to a top plate. Chamber means maintains the chip at the second position in response to fluid pressure differential. The support means is further adapted to receive a chip placement means for transporting the chip from the second position to a third position wherein it engages the board site. Means are provided which in one embodiment take the form of tapering sidewall guides for adjusting orientation of the chip during movement from the first to the second position to insure proper alignment on the site. In one embodiment, the chip placement means is a vertical hollow tube movable vertically between a location within a funnel-shaped aperture and connecting lower vertical cylindrically shaped second tube aperture, and a location adjacent the chip site. Vacuum drawn in the tube while the chip moves into the second position and while the tube is in a first position within the first and second apertures causes the chip to be releasably suspended from the lower end of the tube while the stripping means returns to a first position to strip off a next chip from the stack. The tube then lowers vertically downward toward the chip site carrying the suspended chip downward through the support block and impressing it on the site, whereupon vacuum is discontinued. The chip is thereby deposited on the site as desired.

In a preferred embodiment a plurality of individual just-described chip positioning and placing devices are disposed in the top or "load" plate in a geometric pattern corresponding to the pattern formed by a plurality of such chip sites on a board or substrate at which the chips are desirably to be placed. Each placement device is disposed on the load plate by means of a connector means portion of the mounting block whereby the device may be easily and releasably interconnected to the load plate at the desired location. In this manner, as all of the chips in the support means or magazine of one or more placement devices on the load plate are spent after being placed on a board, the load plate may be removed and replaced with an identical load plate having chip placement means with replenished supplies of chips in order to resume the chip placing operation. A shuttle plate is provided disposed below the load plate with a plurality of apertures extending therethrough in the same geometric pattern as that of the chip placement means. Each stripping means has a downwardly extending projection into a corresponding one of the apertures in the shuttle plate.

In operation, with the load plate carrying the plurality of chip placement means disposed above the shuttle plate with the corresponding projection means of each mounting block disposed in its corresponding aperture in the shuttle plate (whereby the plurality of chip placement means are disposed above the shuttle plate in a generally vertical registry with their corresponding apertures in the shuttle plates), a pattern of these chip placement devices is formed corresponding to the pattern of chips desired to be placed on the board. Means are provided for urging the shuttle plate laterally back and forth whereby the sidewalls of each aperture extending therethrough contact a corresponding projection means. The stripping means of each chip placement means is thereby urged back and forth between a position in which a chip is stripped from the magazine and ready to be supported and placed by the aforementioned vacuum system and the other position wherein the stripping means is positioned to strip a next chip from the stack.

A plurality of next apertures are disposed in the shuttle plate in the same geometric pattern as the desired placement pattern of chips on the substrate whereby when the shuttle plate is returned to the position to strip the next chips, these second apertures are in vertical alignment with the vacuum means for supporting and placing the chip. In this manner, when the chips are accordingly supported by the vertical hollow tubes carrying chips, they may be urged downwards by the tubes through their respective second apertures in the shuttle plate to effect the desired chip placement on the board. In a preferred embodiment the stripping means includes a projection fashioned of a plastic having a preselected shearing force necessary to shear the projection from the stripping means. During the stripping operation should a malfunction occur such as a chip jam, the projection means portion of the stripping means may be readily sheared off by the shuttle plate when the plate exerts a force against the projection exceeding the shearing force due to the jam. In this manner the particular chip placement means having the malfunction may be readily identified for replacement by means of inspection to detect the stripping means having the missing projection means.

BRIEF DESCRIPTION OF THE DRAWINGS

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

BEST MODE FOR CARRYING OUT THE INVENTION

Figure 1:
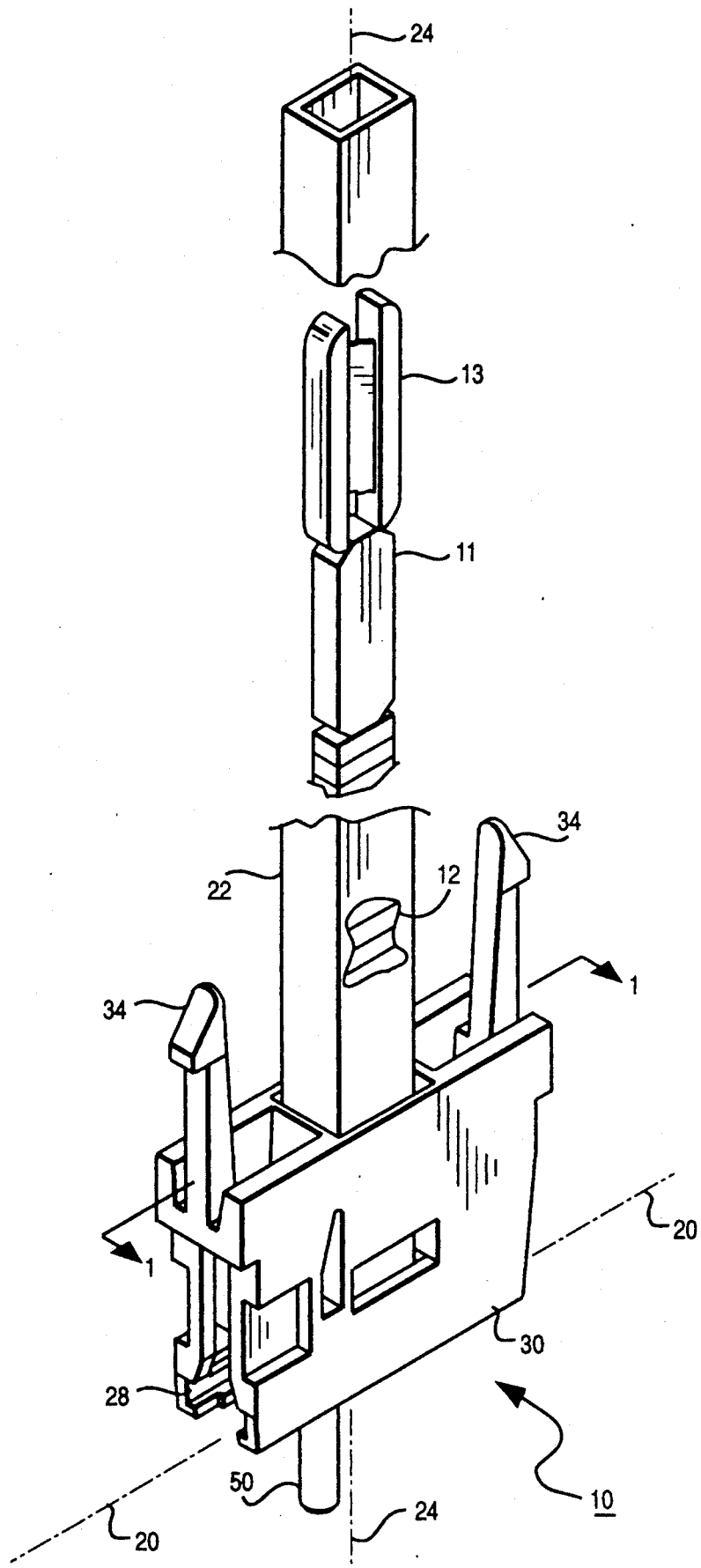
FIG. 1 is a pictorial view, partly in section, of the apparatus of the present invention.
Figure 9:
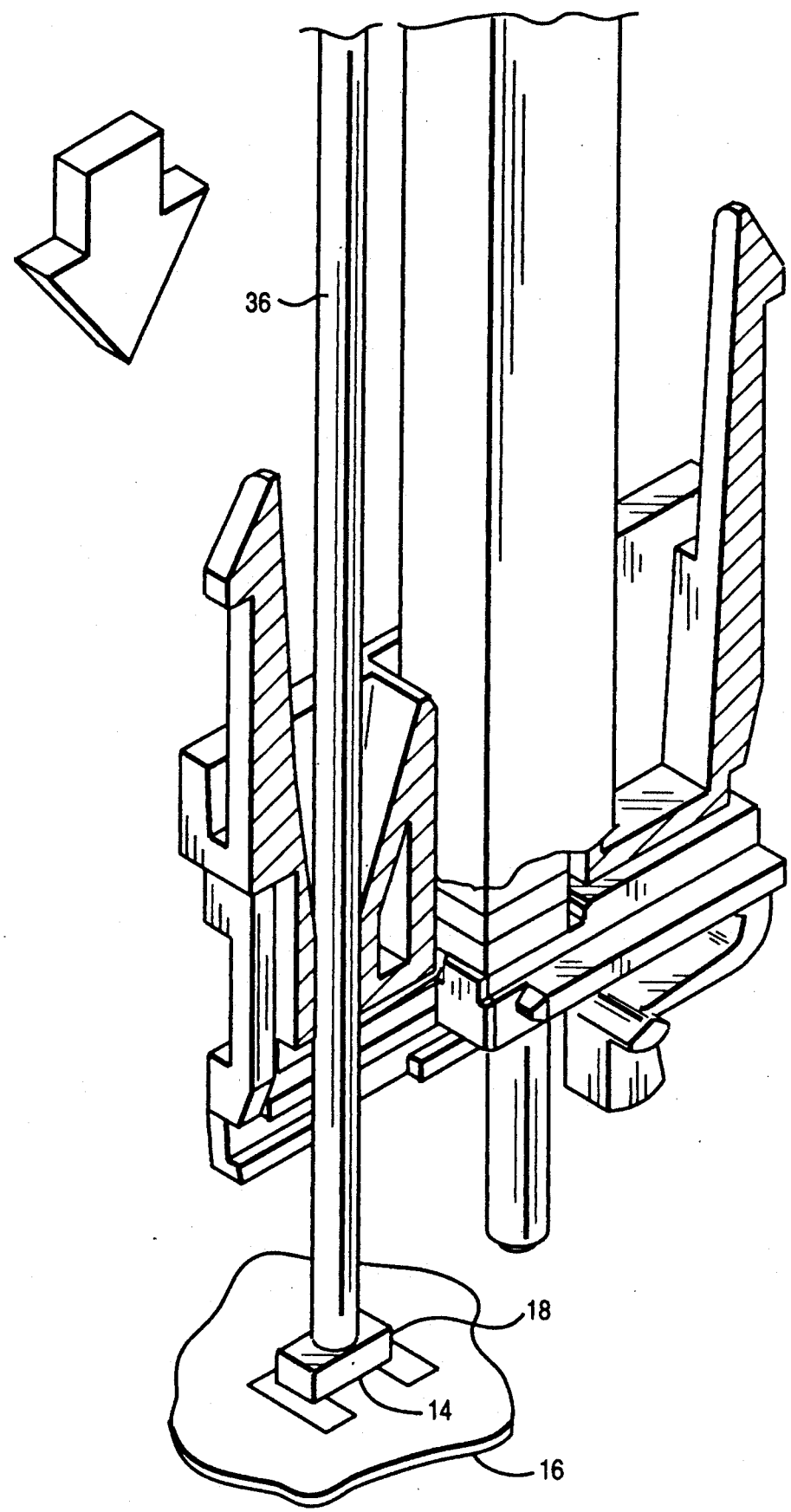

Referring first to FIG. 1, there may be seen depicted therein apparatus 10 of the present invention for sequentially positioning electronic components such as surface mounted chips 12 or the like for mounting at respective sites 14, FIG. 9, on a circuit board 16, FIG. 9.

Figure 6:
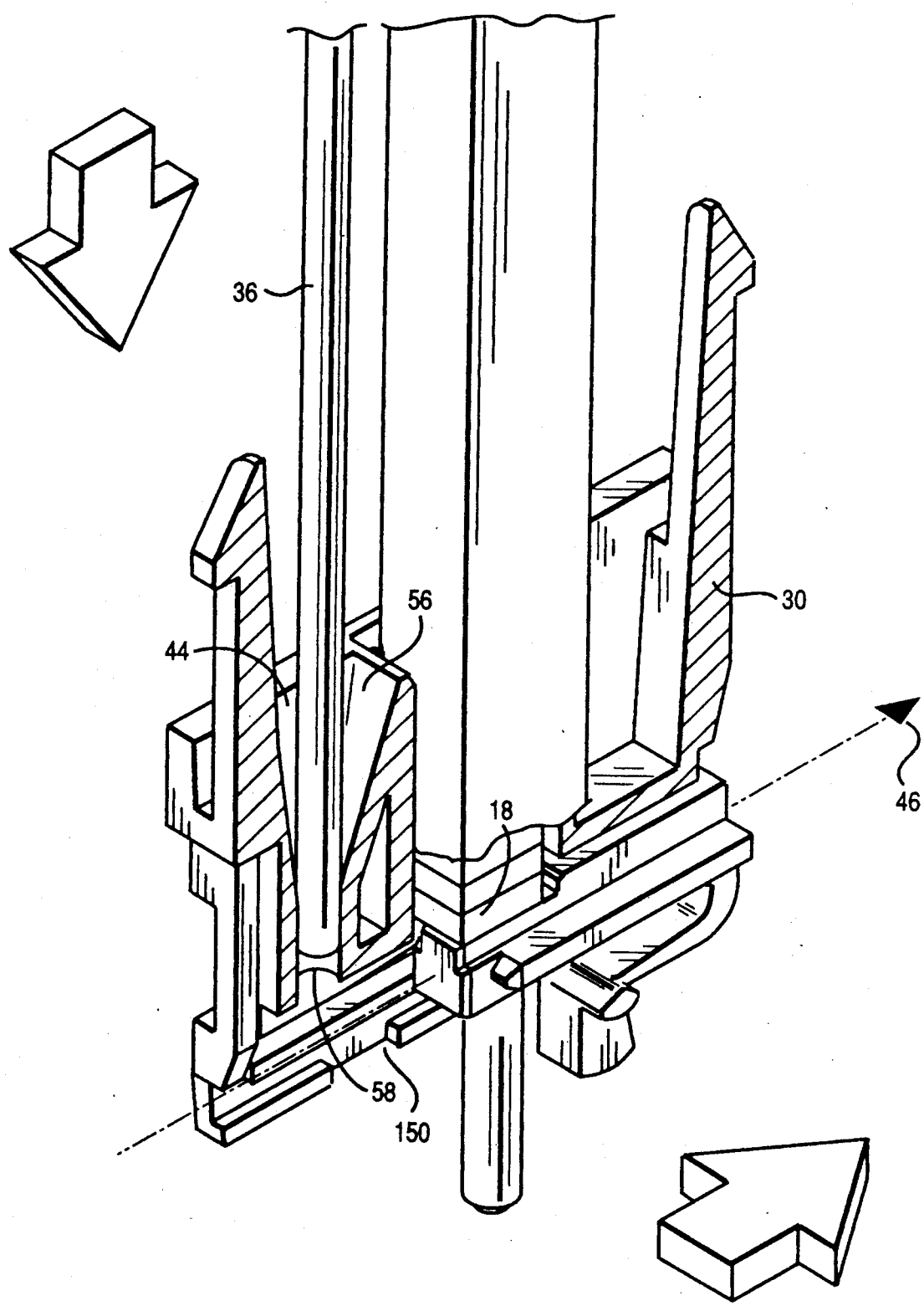

The apparatus 10 is basically comprised of support means for supporting a stack of the components 12 adjacent the board 16, and stripping means for urging the first chip 18 of the stack, FIG. 6, along a line 20 extending generally transversely of the stack. The stripping means is provided to urge each of the chips 12 along the line 20 from a first position within the stack, FIG. 6, to a second position, FIG. 8, opposing a corresponding site on a circuit board, prior to the chip 18 being mounted on the site 14 as shown in FIG. 9.

The support means may take the form of a magazine 22, FIG. 1 receiving a plurality of the chips 12 arranged in a stack therewithin defining a longitudinal axis 24. A stopper 13 press-fit into magazine 22 may be provided to prevent spillage of components out the end of magazine 22. A weight 11 assists downward gravity feed of components. The stripping means may preferably take the form of a slider 26, FIG. 2, in slidable engagement with mating cavities 28 extending internally of a mounting block 30.

Overall operation of the apparatus will be generally described with reference to FIGS. 5-9 and FIG. 13. This will be followed by more detailed description of the structure of the apparatus.

Figure 10:
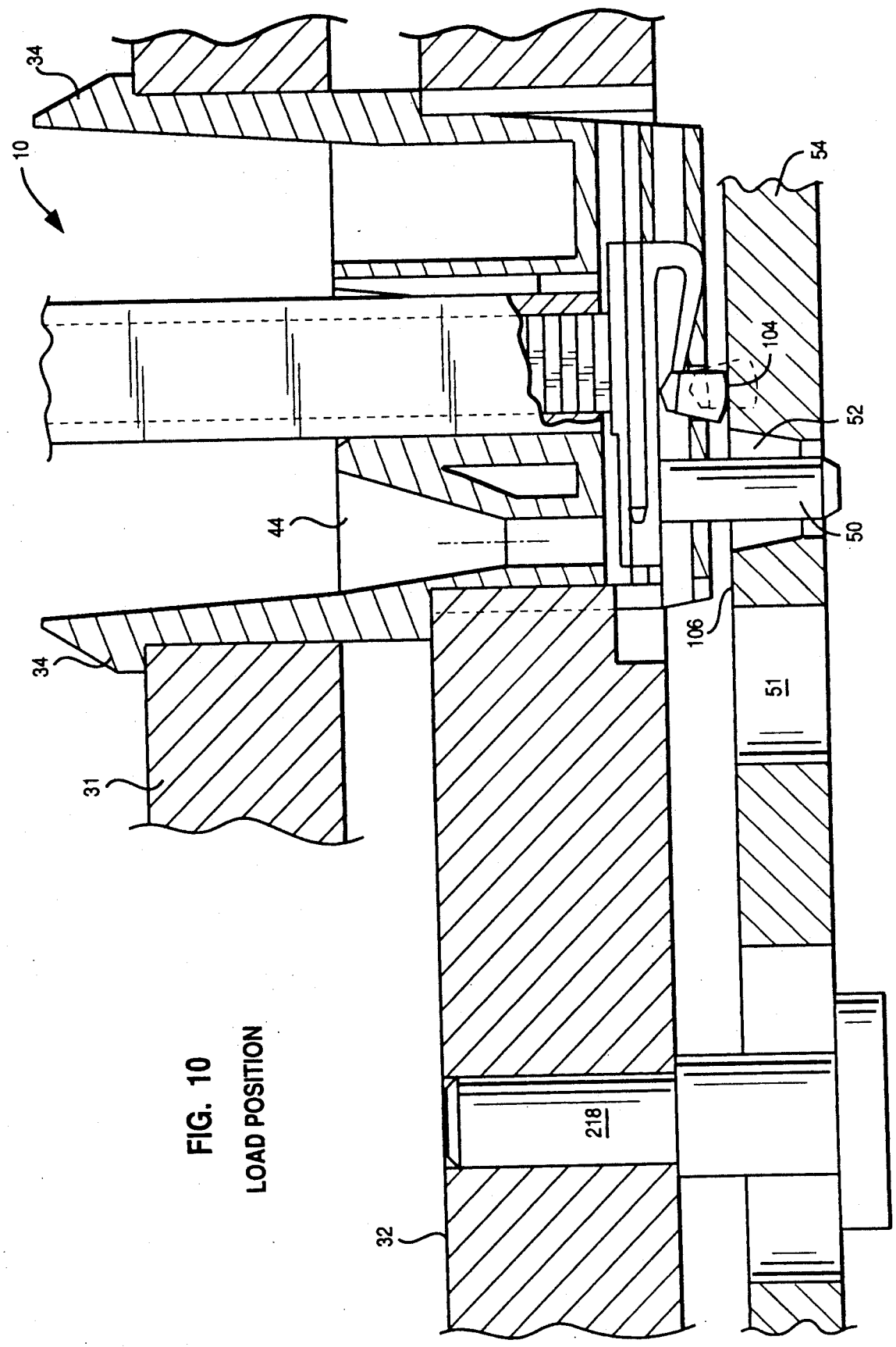
FIGS. 10-12 are side views, in section taken along line 1—1, of the apparatus of FIG. 1 in a mounted position depicting sequential operation of the slide locking feature of the present invention.

With brief reference first to FIG. 10 however, the apparatus 10 will preferably be positioned on a load plate 32 having a pair of connector means 34 for releasably supporting the apparatus 10 thereon. Whereas it is contemplated by the present invention to provide a plurality of such apparatus 10 carried by various locations in the plane of the load plate 32 (corresponding to a plurality of correlative chip sites 14 also disposed horizontally on the plane of circuit board 16), only a singular apparatus 10 is shown for clarity.

Figure 5:
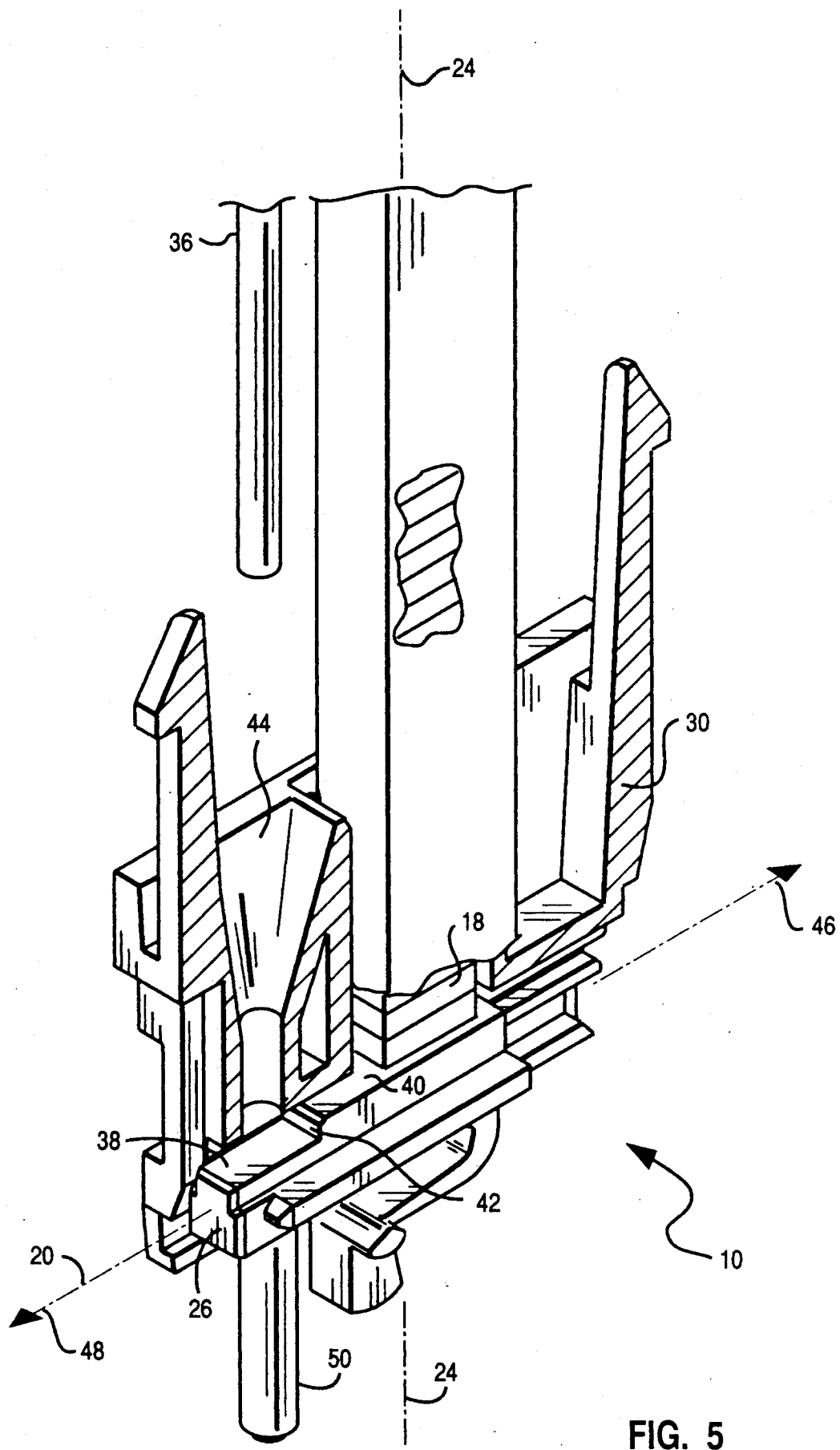
FIGS. 5-9 are pictorial views, partly in section taken along line 1—1, of the apparatus of FIG. 1 taken at respective first, second, third, fourth and fifth operational stages.

Referring now to FIG. 5, apparatus 10 is depicted therein in a first operational. Tube 36 is withdrawn to this position only during unloading. In this first state a vacuum tube 36 has been withdrawn upwards above a chamber means in the form of a vacuum tube aperture 44 extending downwards generally through the block 30, the purpose of the tube 36 and aperture 44 to be described hereinafter. Also in the first state of apparatus 1, after loading the slider 26 is moving along line 20 in the general direction of arrow 46. It will be noted that the first chip 18 of the stack is in a first position within the stack in vertical registry therewith.

With reference to the general description of FIGS. 5–9, the slider 26 will be shuttled back and forth along line 20 in the direction of arrows 46 and 48. Although the mechanism whereby this is accomplished will be hereinafter described in greater detail, for present purposes it will be noted that the slider 26 is provided with a projection means 50 extending downwards. With reference to FIG. 10, this projection means 50 will preferably extend into an aperture 52 within a shuttle plate 54. Reciprocating movement of the shuttle plate 54 in the direction of arrows 46 and 48 will cause engagement of the shuttle plate 54 with the projection means 50 thereby causing correlative urging of the slider 26 along the line 20 in the desired manner.

Still referring to FIG. 5 yet an additional aspect of the slider 26 may be noted, namely that a plurality of surfaces hereinafter referred to as a first stripper surface 38, second stripper surface 40, and step surface 42 are disposed in the upper portion of the slider 26. In the first operating state of FIG. 5, the lower surface of the first chip 18 will ride on the second surface 40 during aforementioned movement of the slider 26 in the direction of arrow 46. In this manner, the stack of chips will be supported and maintained in a substantially constant vertical alignment along the longitudinal axis 24 of the stack during the movement of slider 26.

Referring now to FIG. 6, the apparatus 10 is shown in a second operational state. The vacuum tube 36 has been urged from the first position shown in FIG. 5 downwards to a second position disposed within the aperture 44. The conical shape of the surface 56 of block 30 defining the aperture 44 is for purposes of guiding the tube 36 into vertical alignment within the smaller cylindrically shaped second vacuum tube aperture 58. Also in this second operating state, the slider 26 has been urged by means of the aforementioned shuttle plate 54-projection means 50 combination sufficiently in the direction of arrowhead 46 so as to cause the first stripper surface 38 of slider 26 (better seen in FIG. 5) into a position in vertical registry with the stack and the longitudinal axis 24 thereof. During such movement the stack is caused to drop generally downwards in the direction along axis 24 until the lowermost first chip 18 is disposed with the lower surface thereof in engagement with the first stripper surface 38.

Figure 7:
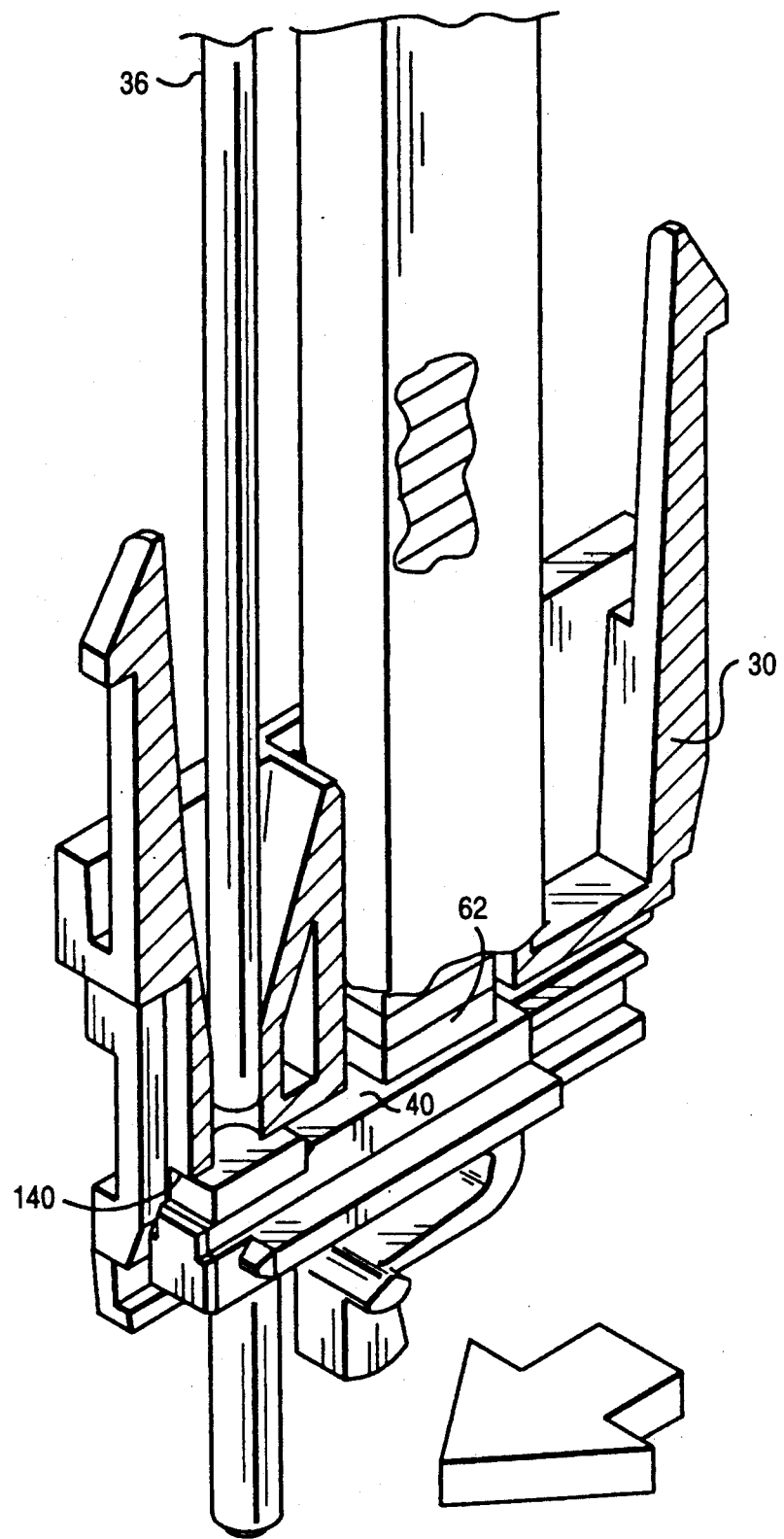
Figure 13:
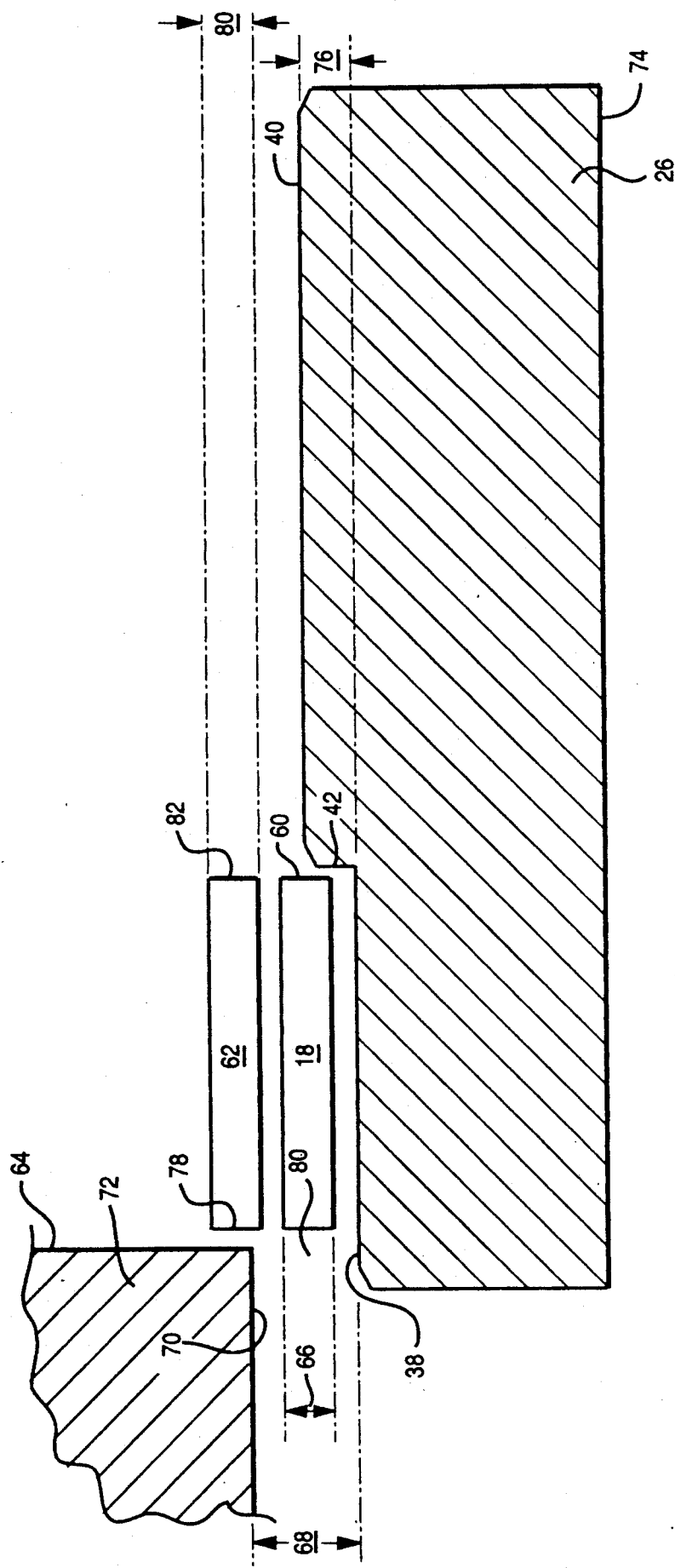
FIG. 13 is an enlarged simplified side view, partly in section taken along line 1—1, of a portion of the stripper, chips, and mounting block of the apparatus in FIG. 1 depicting in more detail relative dimensional relationships thereof.

Referring now to FIG. 7, the apparatus 10 is depicted therein in yet a third operational state wherein the slider 26 has been urged by shuttle plate 54-projection means 50 from the first position shown in FIG. 6 along the line 20 to the second position shown in FIG. 7. With reference to FIG. 13 it will be noted that during such movement the step surface 42 engages the vertical edge 60 of the lowermost first component 18 of the stack stripping the component 18 from the stack and transporting it from its first position shown in FIG. 6 to its second position shown in FIG. 7 in vertical alignment with the vacuum tube 36, vacuum tube aperture, 44, and second vacuum tube aperture 58.

While the apparatus is moving into the third operational position of FIG. 7, a pressure difference is established vertically across the first chip 18. In one form, a vacuum is drawn on the tube 36 thereby lifting the first component 18 in a vertical direction until it abuts surface 140 of block 30, thereby retaining it in the position shown. It will also be noted that by stripping the lowermost first component 18 from the bottom of the stack, a second component 62 which was vertically adjacent and above the first component when disposed in the stack has been caused to be supported by the second stripper surface 40 while in sliding engagement with the lower surface of this second component as the slider 26 is moved from the first position of FIG. 6 to the second position of FIG. 7. This in turn causes vertical support of the stack during such movement whereby this second component 62 has, by means of removal of the lowermost first component 18, thereby been made to occupy the lowermost position in the stack vacated by the first chip.

Figure 8:
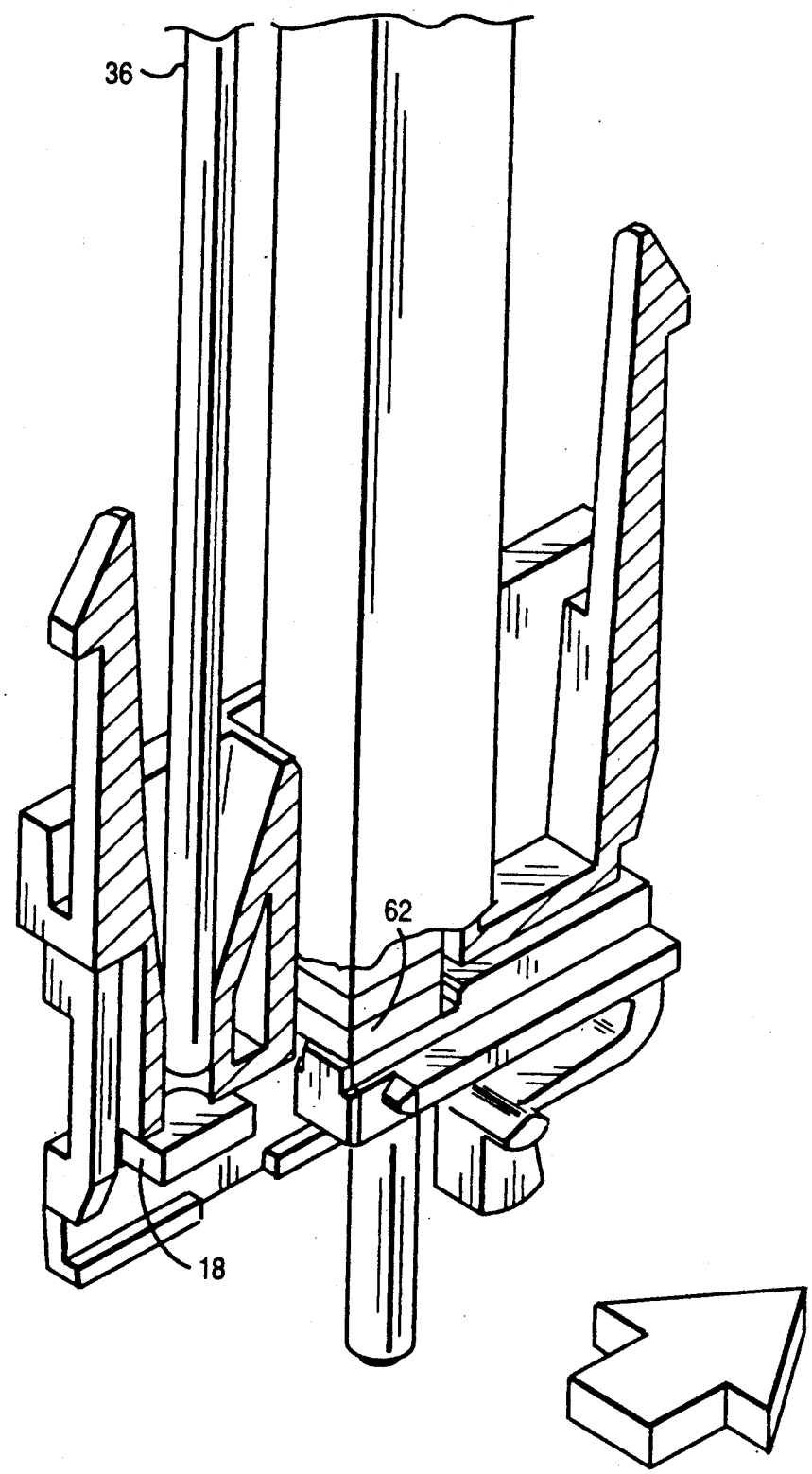

With reference to FIG. 8, the apparatus 10 is depicted in yet a fourth operational state. In this state, the slider 26 has been urged, again by means of the projection means 50-shuttle plate 54 along line 20 in the direction of arrowhead 46 to the first position. Due to the aforementioned vacuum being drawn by the tube 36, the previously lowermost chip 18 of the stack is retained in the second position shown in FIG. 8. A comparison of FIGS. 7 and 8 will indicate that the second component 62, as the slider 26 moves into the first position of FIG. 8 will be caused to slide off of the second stripper surface 40 down onto the first stripper surface 38.

FIG. 9 depicts the apparatus 10 in a fifth operational state. From a comparison with FIG. 8, it will be appreciated that the vacuum tube 36 has been urged in a generally downward direction along the longitudinal axis of the tube to a third position as shown in the figure. A slot 153 in the bottom of block 30 permits movement of the tube 36 and chip 18 therethrough so as to effect the operational states of FIGS. 8 and 9. Due to the vacuum being drawn by the tube 36, the first component 18 is carried downward with the tube until it is pressed into the circuit board 16 at the desired corresponding site 14 at a third position of the chip 18. Upon pressing the chip 18 into the site 14 (which may have an adhesive material deposited thereon previously), the vacuum is discontinued and tube 36 is thence raised vertically to the first position shown in FIG. 5 whereupon the sequence of operations may be repeated after a next circuit board 16 is placed in registry beneath the apparatus 10.

Figure 11:
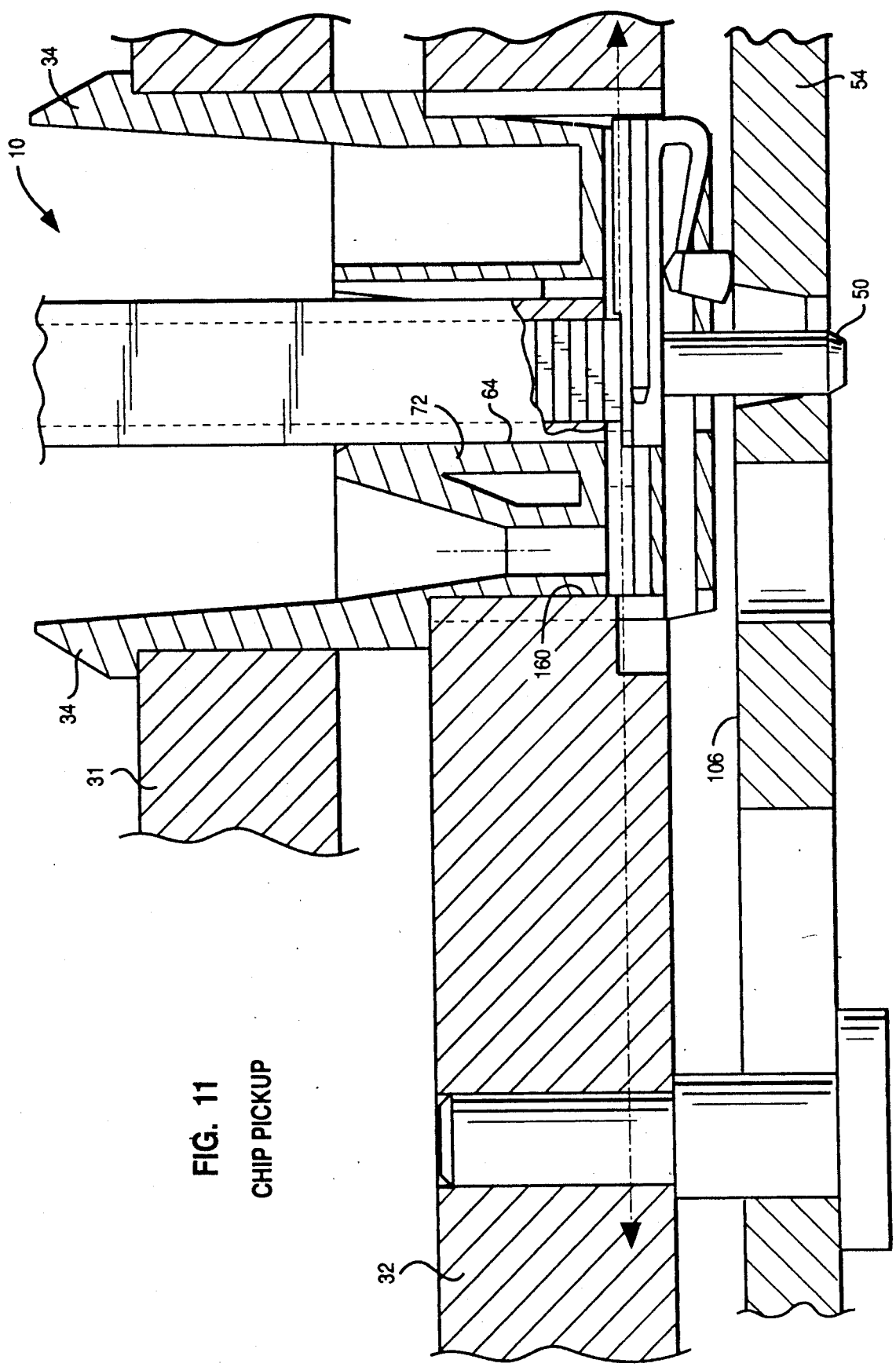

Important dimensional relations between the slider 26, first and second chips 18 and 62, respectively, and block 30 will now be noted. With reference to FIG. 11 and 13 the block 30 contains internally thereof a retainer means 72 for preventing movement of the second chip 62 in the direction of the transverse line 20 during the urging of the first chip 18 along the line by means of the slider 26. As may be seen from FIG. 13, the retainer face 64 of the retainer means 72 will matingly engage second chip face 78 during movement of the slider 26 to prevent the second chip 62 from being carried along with the first chip 18 by the slider 26. The first and second chips 18 and 62, respectively, will define a corresponding first chip thickness 66 and second chip thickness 80. A first distance 68 will further be defined by the distance between a lower surface 70 of the retainer means 72 and the upper first stripper surface 38 of the stripper 26 when in sliding engagement with the block 30. This first distance 68, as may be seen from FIG. 13, will preferably be selected in magnitude so as to be slightly larger than the magnitude of the first thickness 66 of the first component 18 and less than the sum of this first chip thickness 66 and the chip thickness 80 of the adjacent second component 62. If the first distance 68 was selected to be equal to or less than the first chip thickness 66, the first chip 18 could not thereby readily and reliably slide through the aperture 80 between the lower surface 70 of the retainer means 72 and the upper first stripper surface 38.

Conversely, if the first distance 68 was to equal or exceed the sum of the magnitudes of the first and second thicknesses 66 and 80 of corresponding first and second chips 18 and 62, the second chip 62 would not thereby be restrained from being carried by the slider 26 during urging of the first chip 18 along the line 20.

Referring to FIG. 11 a location surface 160 is provided in shuttle plate carrier 32. Machining in load top plate 31, carrier 32, and shuttle plate 54 are with reference to common tooling pin reference points on all plates in a manner well known in the art so as to assure proper relative vertical positioning of the various components, apertures and the like herein described. Accordingly, for example, the location surface 160 is so machined very accurately relative to these tooling pin references. The surface 160 serves as a stop (see FIG. 12) whereby further movement leftward of the first chip 18 is prevented thereby accurately positioning the chip transversely in a desired location relative to tube 36 and site 14. In this manner tolerance problems are eliminated in seeking to stop chip movement by a component carried by block 30 which for example might be capable of moving laterally slightly while mounted in carrier 32.

Referring again to FIG. 13, a second distance 76 is defined between the first and second stripper surfaces 38 and 40, respectively, which will preferably be slightly less in magnitude than the first chip thickness 66. If this second distance 76 equals or exceeds the first chip thickness 66, as the stripper 26 moves along line 20 stripping off the lowermost first chip 18 from the stack by means of the step surface 42 engaging the edge 60 of the first chip 18, this step surface 42 would also engage the edge 82 of the second component 62 thereby undesirably also urging it along the line 20.

Figure 3:
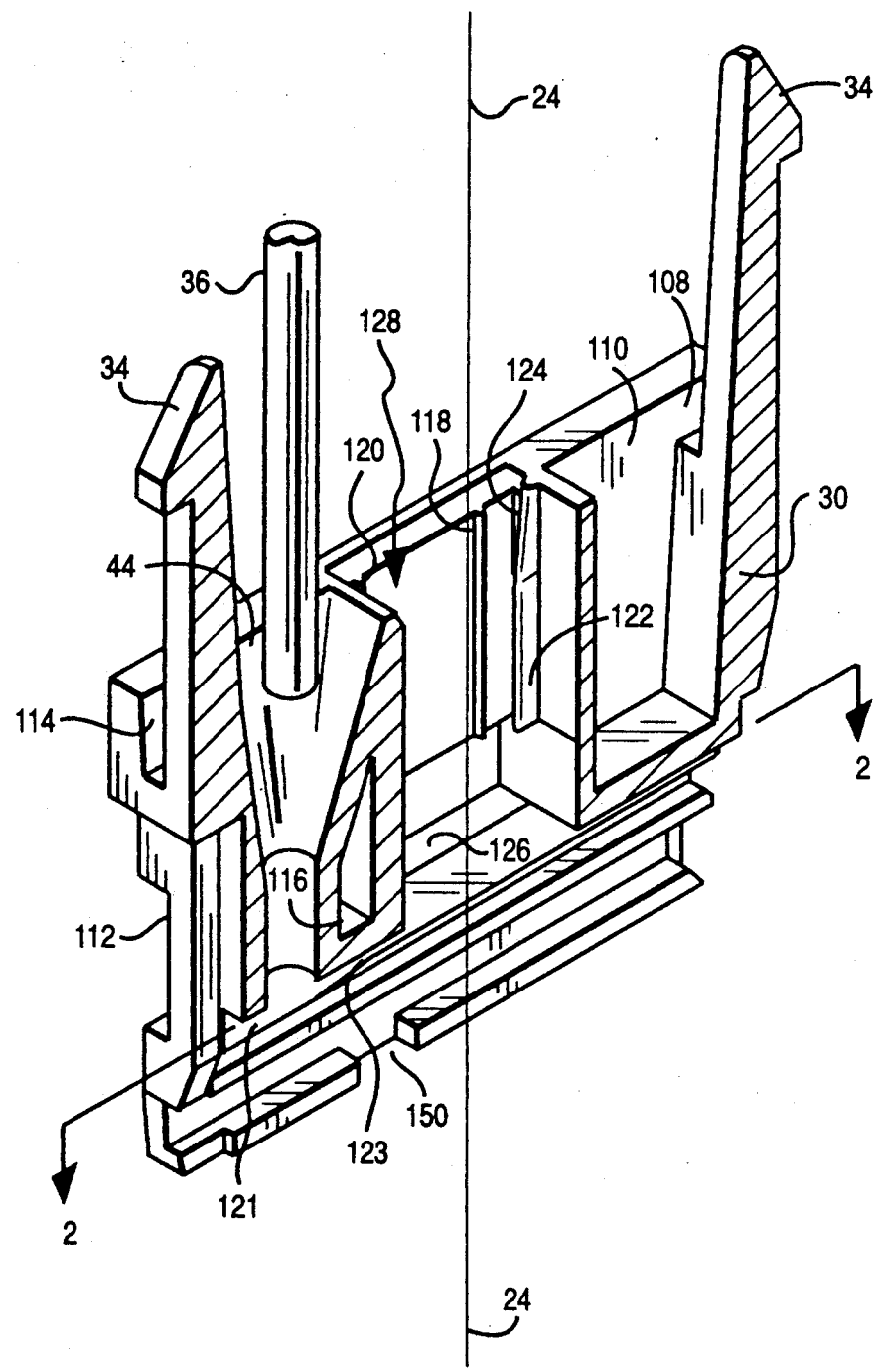
FIG. 3 is a pictorial view of the apparatus of the present invention in section taken along line 1—1 of FIG. 1.
Figure 14:
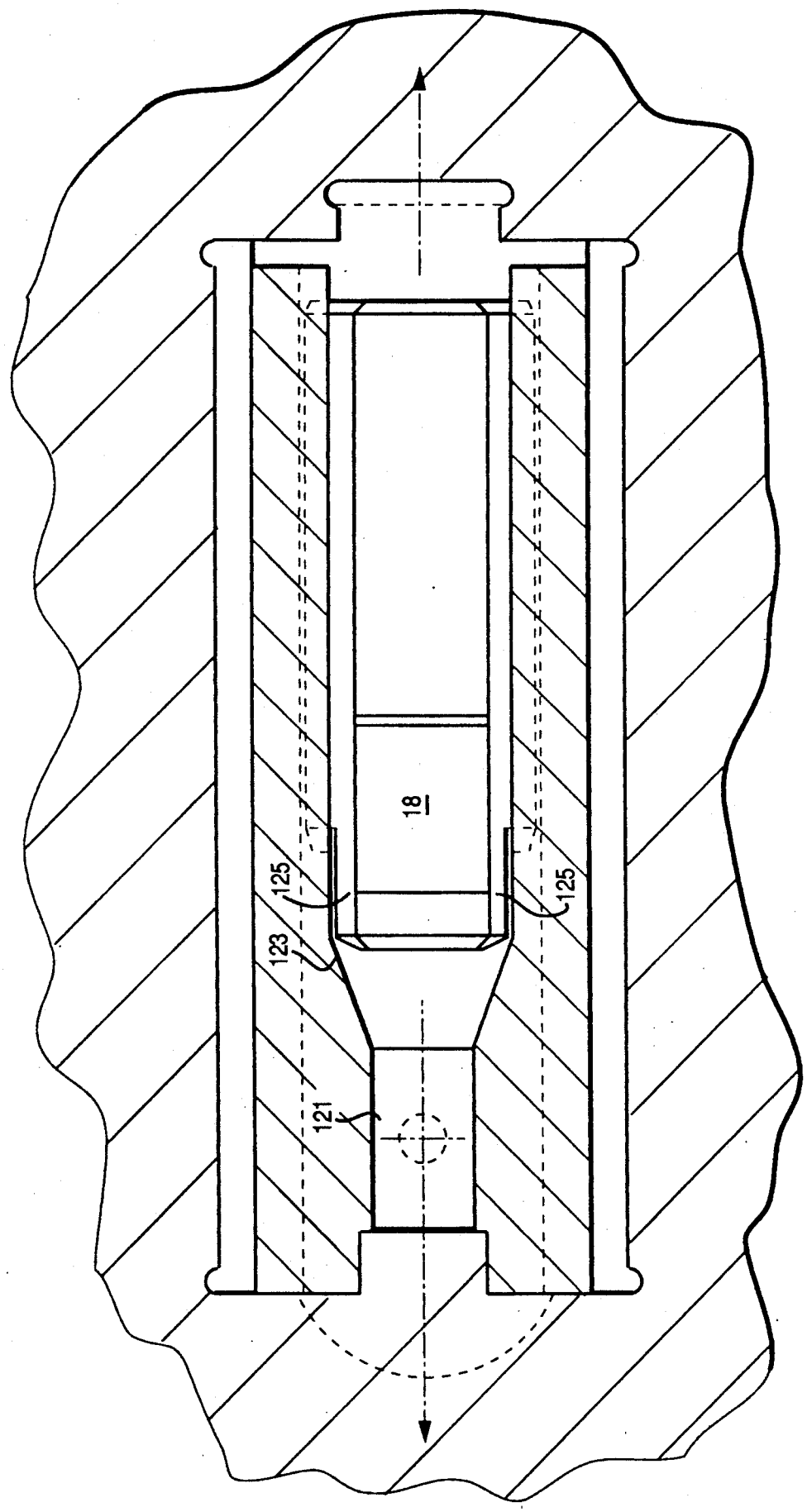
FIG. 14 is a simplified top view in section taken along line 2—2 of a part of the apparatus depicted in FIG. 2 illustrating the guide surfaces 121, 123.
Figure 15:
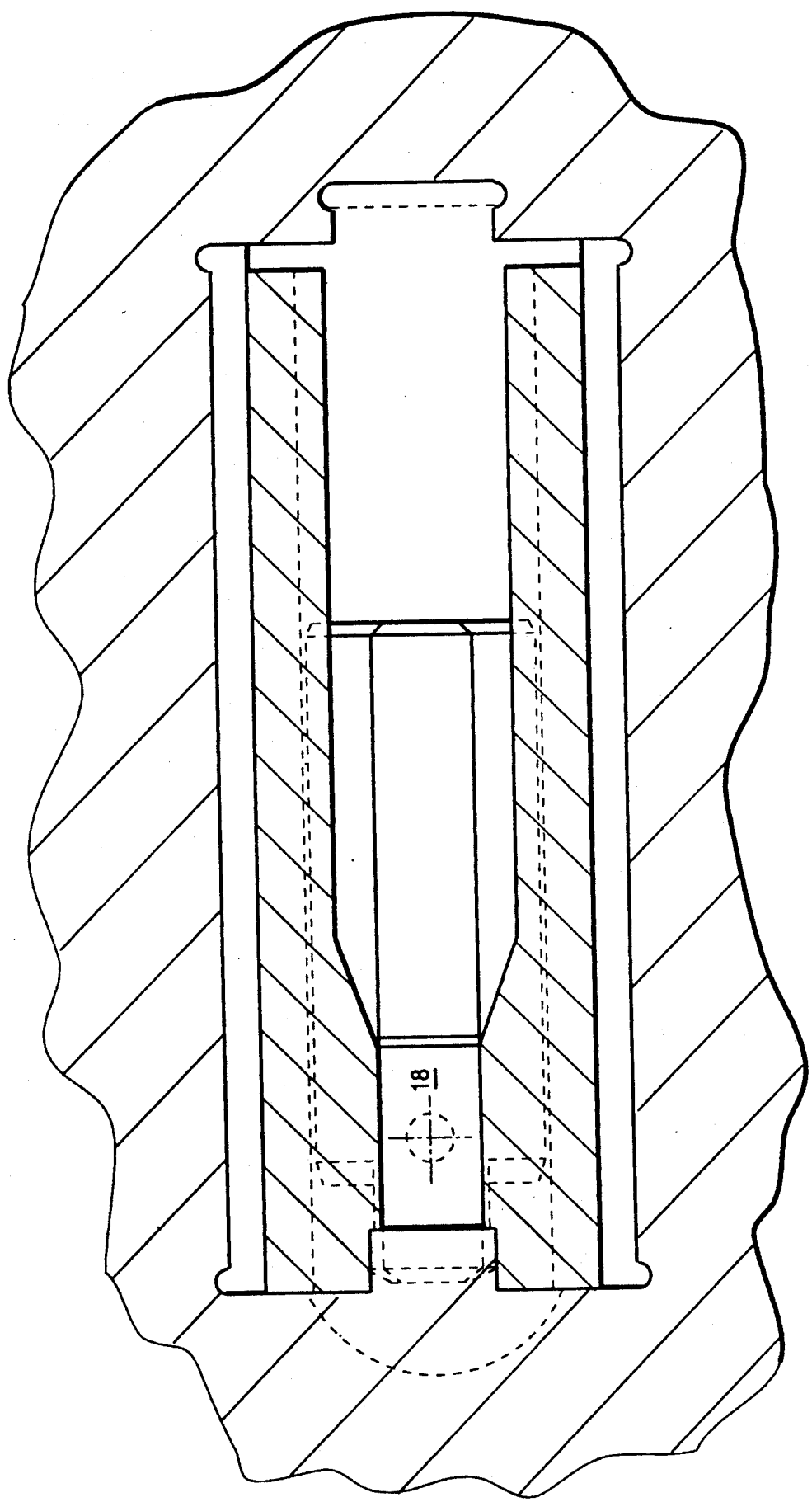
FIG. 15 is another simplified top view in section taken along line 2—2 of a part of the apparatus depicted in FIG. 2 illustrating the guide surfaces 121, 123.

As shown in FIGS. 3, 14, and 15, the block 30 is provided with opposing surfaces 121 parallel to line 20 and opposing surfaces 123 angulated away from line 20. The transverse distance between surfaces 123 is greater than chip 18 width and decreases with movement in the direction of arrow 48. Transverse distance between surfaces 121 is approximately the width of chip 18. Accordingly as the chip travels from the position of FIG. 14 to that of FIG. 15, the tapering surfaces 123 contacting leading edges 125 of chip 18 serve to guide or adjust orientation thereof relative to the line 20 during such movement to a final desired orientation. This is maintained by the surfaces 121 contacting the chip sides.

Figure 2:
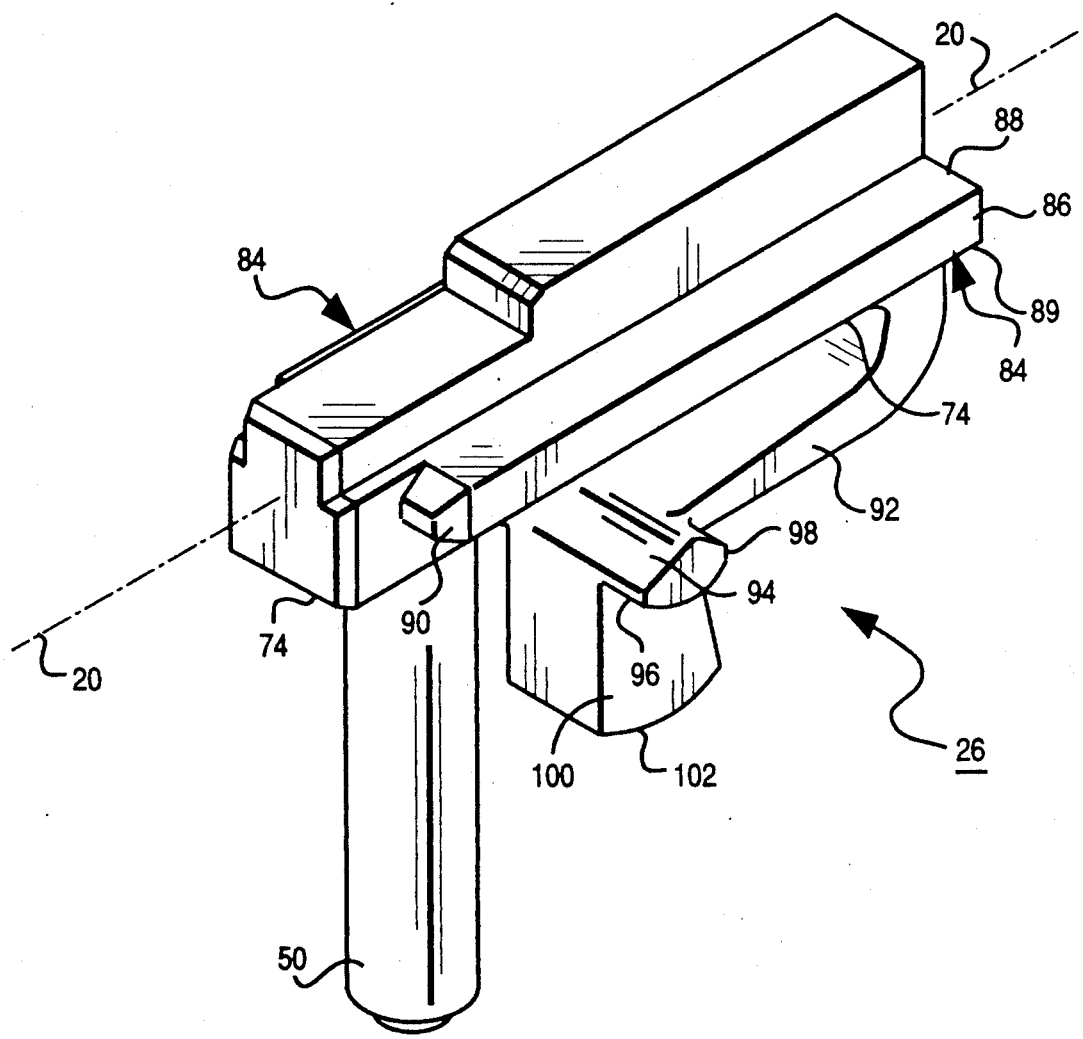
FIG. 2 is a pictorial view of the slider portion of the apparatus of FIG. 1.

With reference to FIG. 2, the slider 26 will now be described in greater detail. First it will be noted that the slider 26 is preferably symmetrical about a vertical bifurcating plane including line 20 and vertical axis 24. This symmetry is also true with respect to the block 30. Accordingly, for simplicity, throughout this disclosure features of the slider 26 and block 30 may only be described with reference to portions thereof lying on one side of the aforementioned plane. Continuing, with FIG. 2, a pair of rails 84 are disposed on opposing sides of the slider 26, each rail having a rail side 86, rail top 88, rail bottom 89 and lead-in 90, the latter of which may take the form of a taper such as a truncated pyramid. The purpose of these rails 84 and in particular the bottom, side, and upper surfaces 89, 86 and 88, respectively, will become more apparent upon more detailed description of the mounting block 30 and in particular the cavity 28 therewithin. However, in general it will be noted that the aforementioned surfaces will matingly and slidingly engage with corresponding surfaces defining the cavity 28 so as to slidably retain the slider 26 therewithin and to regulate precise movement of the slider 26 along the line 20 within the block 30.

Figure 16:
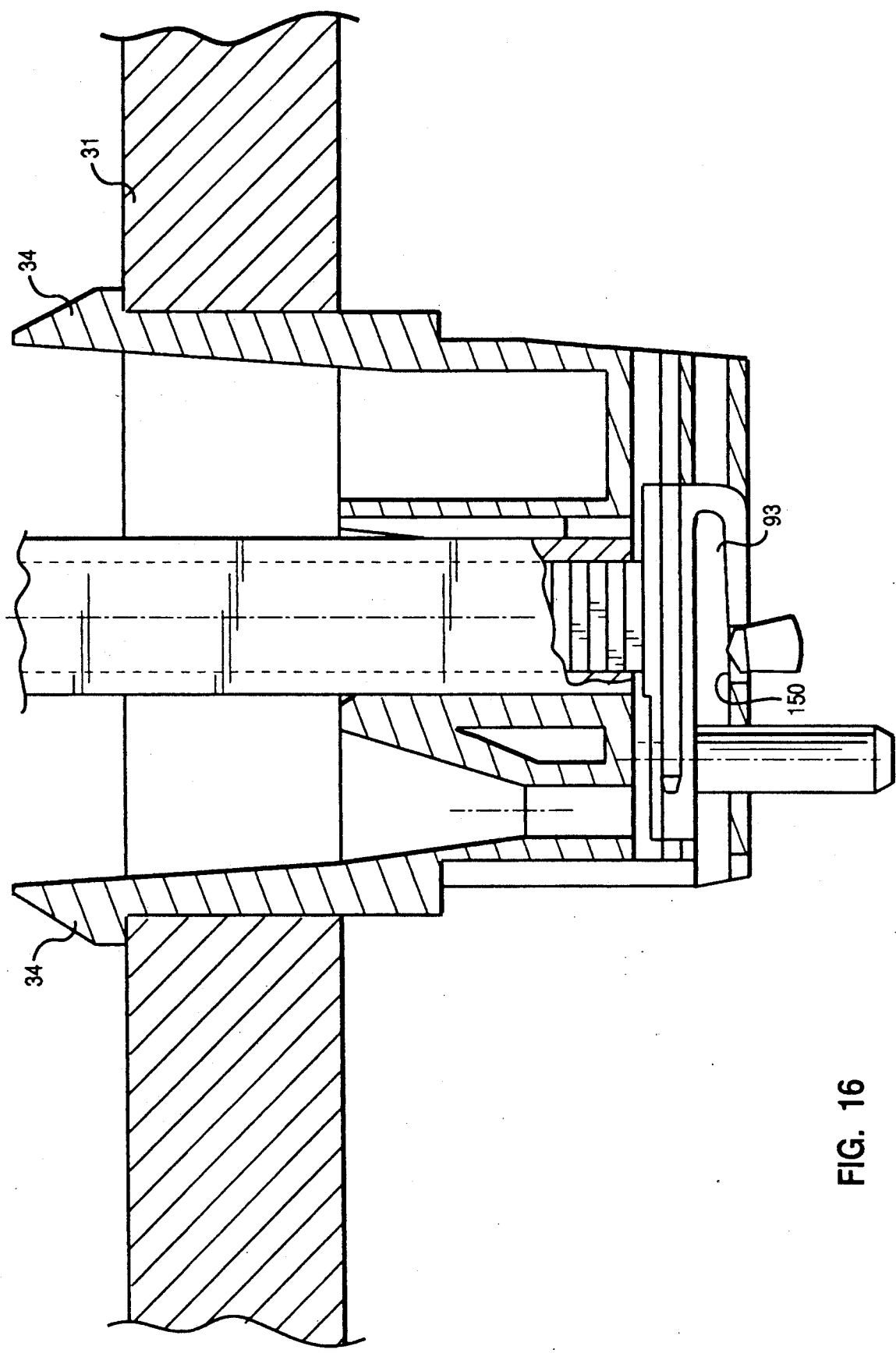
FIG. 16 is a side view, partly in section depicting the apparatus of the present invention in a locked position.
Figure 17:
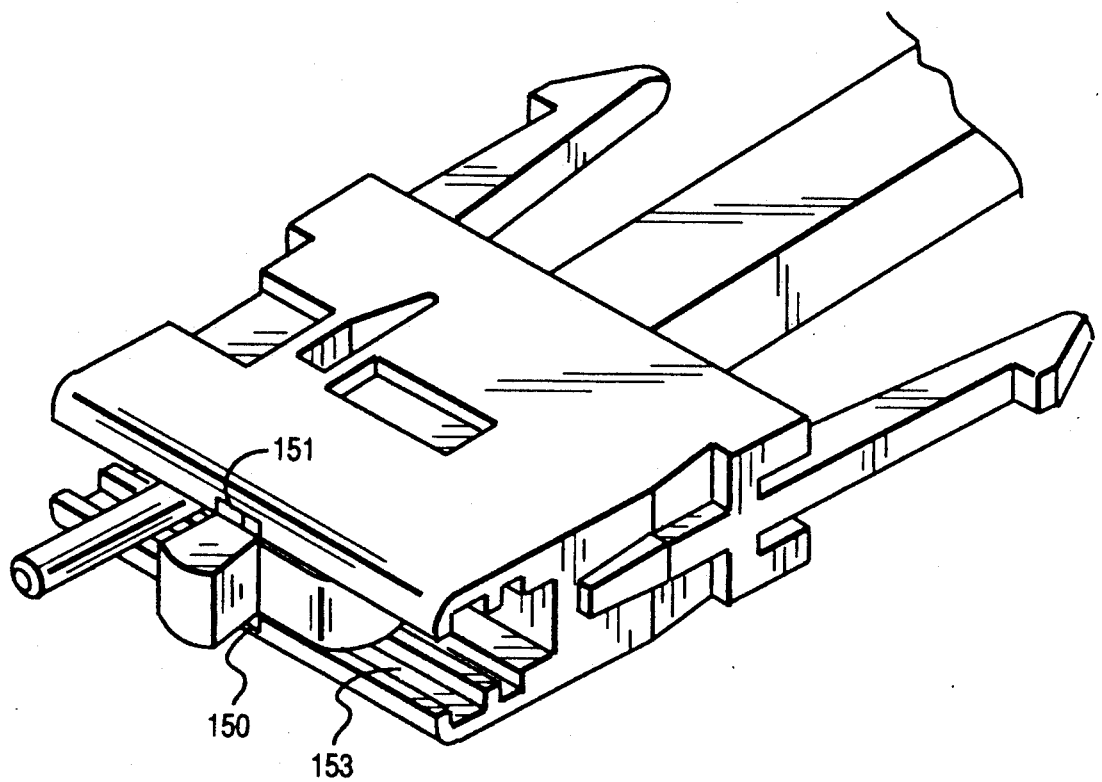
FIG. 17 is a pictorial view depicting the bottom of the apparatus illustrated in FIG. 1.

Still referring to FIG. 2, the slider 26 will also preferably be provided with a cantilevered spring 92 pendantly disposed from one end of the slider 26 opposite the end to which the projection means 50 is also pendantly disposed from the lower surface 74 of the slider 26. The purpose of this spring 92, as will also become more readily apparent with the following description, is basically to bias the slider 26 in an upwards direction for a close fit with the block 30 to take into account manufacturing tolerances in space necessary for assembly of the slider 26 within the block 30. This upward biasing, with reference to FIG. 10, may be seen to be caused by sliding engagement at contact point 104 with the upper surface 106 of the shuttle plate 54 during sliding of the slider 26 along with the shuttle plate 54 relative to the body 30. Yet an additional purpose of the spring 92 will be described in greater detail with reference to FIGS. 10–12, but for present purposes is basically to provide a releasable locking mechanism whereby the slider 26 may be fixed in a releasably locked position with reference to the block 30 as shown in FIG. 16 and 17. In this manner, the apparatus 10 may be transported with the magazine 22 filled with a stack of components 12 to a location wherein one or more such apparatus will thence be mounted as in FIG. 10 with no concern that the slider 26 will inadvertently exit the cavity 28 of the block 30. Such slider movement during transportation would thereby cause the chip contents of the magazine 22 to undesirably fall from within the magazine 22 during such transport or storage prior to use.

Figure 12:
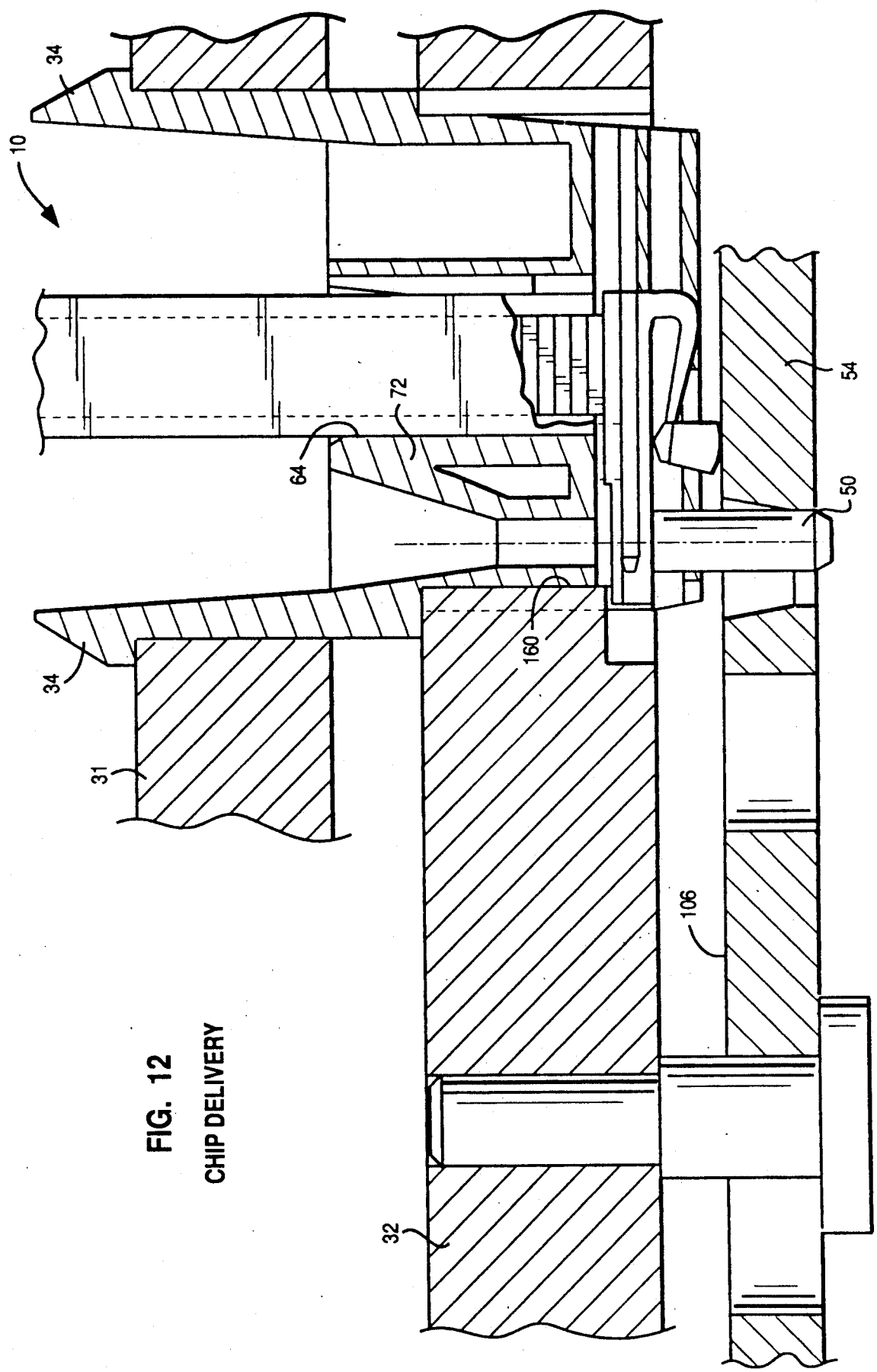

During operation the lower surface 102 (FIG. 2) of the spring 92 rides on the upper surface 106 of the shuttle plate 54 (FIGS. 10-12). As will hereinafter be detailed, at the end of the spring 92 distal to the point of interconnection of the spring 92 to the lower surface 74 of the slider 26, a wing shaped locking member 94 is provided having leading and trailing edges 96 and 98, respectively. Pendantly disposed intermediate the ends of the locking member 94 and downwards therefrom is a detent 100 portion having the aforementioned lower surface 102 which slidingly engages the shuttle plate upper surface 106. In the locked position, the wing-shaped projections of the locking member 94 on either side of the bifurcating plane will engage corresponding cavities 150, and 151 (FIGS. 3, 4, 6, 17) so as to prevent the slider 26 from sliding along line 20 relative to the block 30 during transportation and non-use of apparatus 10. Due to the spring action of the spring 92, this distal end thereof including the detent 102 and locking member 94 may be moved vertically upwards and downwards. In this manner when it is desired to unlock the slider 26, as shown in the positions of FIGS. 10, 11 and 12, the locking member 94 including the detent 100 may be moved upwards and outward from their mating cavities 150, 151 when in the locked position (FIG. 16) to the unlocked positions (FIGS. 5-9), to permit desired movement of the slider 26 along line 20 during operation of the apparatus 10. During unlocked operation locking member 94 will travel within cavity 93, FIG. 16.

A more detailed description of the preferred construction of block 30 will now be given with reference to FIGS. 3 and 4. First, it will be noted from FIG. 3 that a plurality of cavities 108, 110, 112, 114 and 116 are provided in the body of the block 30. The purpose of these cavities is primarily a practical consideration well known in the art of forming plastic components from a mold which is the preferred method of manufacture for the block 30. More particularly, these cavities provide for a more uniform wall thickness of many portions of the cavity thereby effecting a more uniform formation of the block 30 in the manufacturing process. With respect to cavities 108 and 114, however, yet an additional purpose thereof is to remove material from the base of the connector means 34 thereby permitting them to more readily flex to provide a press fit to the top plate 31 and to more readily releasably engage therefrom.

Figure 4:
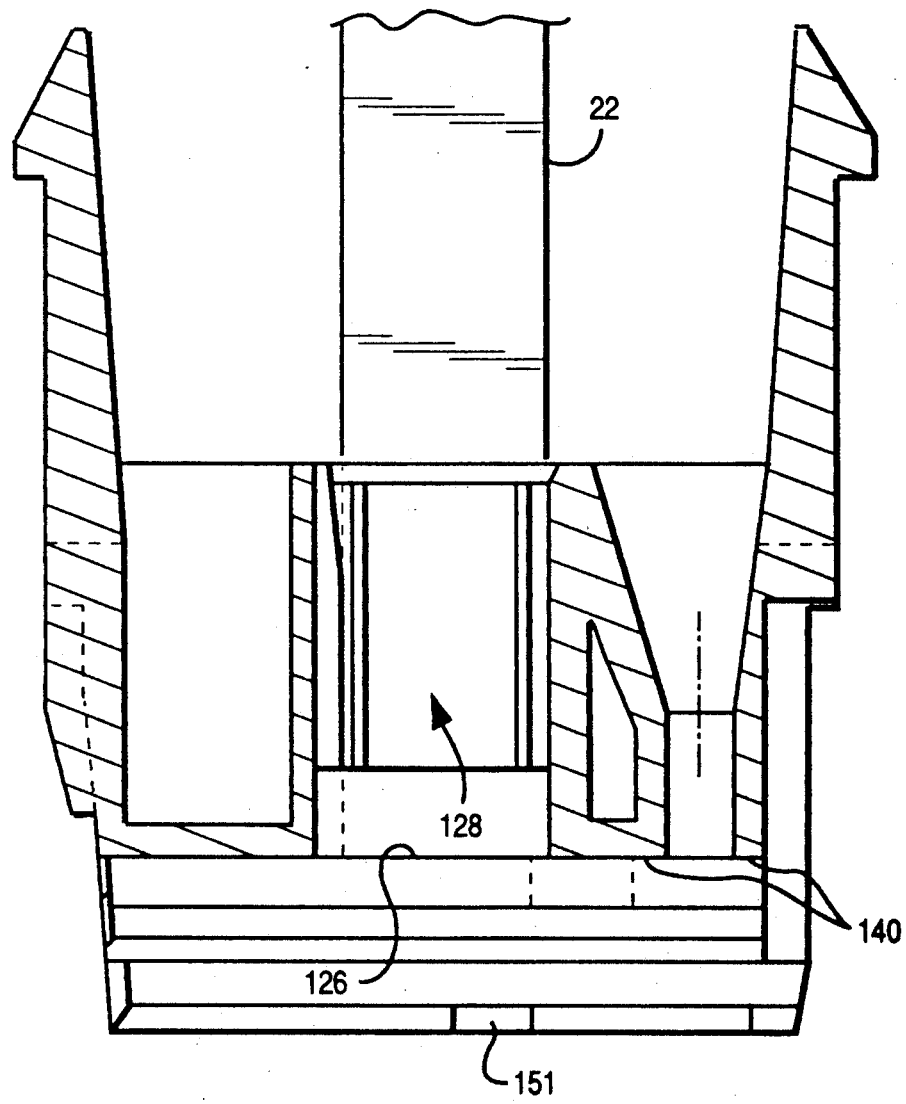
FIG. 4 is a reverse side view of the apparatus of FIG. 1 in section taken along line 1—1.

Still referring to FIGS. 3 and 4, a particular feature of the walls defining the generally rectangular cavity 128 through which the longitudinal axis 24 extends will now be noted. Specifically, ridges 118 and 120 on opposing first faces of the walls will be provided the purpose of which is to provide deformable edges in sliding engagement with the magazine 22 as it is inserted into the cavity 128 so as to provide a tight interference fit, thereby retaining the magazine 22 securely within the cavity 128. A similar function is provided by a ridge 122 on another face also defining the cavity 128 extending perpendicularly to the first faces. With respect to this latter ridge 122, a guide portion 124 thereof is angulated inwards toward axis 24 thereby easing initial insertion of the magazine 22 while gradually providing an increased interference fit between the block 30 and magazine 22 as the latter is increasingly inserted within the cavity 128. A lower face 126 lying in a plane generally normal to the longitudinal axis 24 is provided which acts as a stop preventing further downward insertion of the magazine 22 within the cavity 128 by means of abutting engagement with the lowermost end of the magazine 22 as it is inserted within the cavity 128. The function of this face 126 may be more clearly seen with reference to FIG. 4 which shows the lower end 128 of the magazine 22 in abutting engagement therewith.

The invention is intended for use with leadless components such as passive surface mount resistor and capacitor chip components in a block-like shape although it may be adapted for use with cylindrically shapped components such as "MILFS" known in the art. The typical leadless components placed by the apparatus of the invention comprise a rectangularly shaped block having the desired electrical properties with a pair of electrically conductive surface areas disposed at either end thereof which are generally flush with the remaining surfaces of the block so as to form the rectangle. This is to be distinguished over other components known in the art having various leads from the component in the form of wire or pin-like extensions, such as those in the conventional dual inline packages, or the like. Representative such leadless chips are manufactured by the Panasonic Corporation and, for example the Rohm Corporation such as the SMC Component Part No. 59X0984 by the latter.

Numerous variations in the form of the electrical surface area contacts of the leadless components are encountered which may be placed by the apparatus of the invention without departing from the teachings thereof. Thus, for example, some components are found wherein the entire opposing end surface areas of the component are coated with the conductive material. Other chip components may have a conductive material disposed only on one (and generally the same) surface at opposing ends, or may, alternatively, carry conductive material on oppose sides of the component at each end thereof.

As to the geometrical properties of the chips which have been found to be effectively placed by the apparatus of the invention, it has been found that chips known in the art as "1206" having dimensions $0.120 \times 0.060$ inches have been consistently placed in production employing the apparatus of the invention, with limited testing indicating that "0805" chips having dimensions $0.080 \times 0.050$ may also be readily placed with no apparent limit to the diminutiveness of the chips which may be successfully placed. As to the aforementioned chips' thicknesses, nominally such thicknesses encountered have been 0.030 to 0.050 inches for capacitors and 0.018 to 0.030 for resistors. Thickness variations beyond these tolerances have been found to create some problems in avoiding the possibility of feeding either no chips or two chips in one feed operation. It will be readily apparent that the slider mechanisms, however, may be adjusted with different pick heights to accommodate the aforementioned tolerance ranges. It has further been found preferable to control the chip widths to $\pm 0.006$ inches rather than the industry standard of $\pm 0.008$ inches in order to increase the width:thickness or aspect ratio which has been found to assist in the reliability of the chip load and feed cycles.

Various failure modes have been noted in the course of development of the invention, the first being a phenomenon of the chips adhering together and thereby hanging up in the supply tubes. This has been thought to be attributable to the chemical makeup of the conductive end terminations of the chips which typically have a lead and tin alloy makeup. The problem was found to be alleviated by specifying substantially 100% tin composition in the makeup in the end terminations. A second failure mode noticed was the tendency of chips to adhere together and fail during the chip feed or stripping operation. With respect to capacitor-type components the problem was substantially reduced by again specifying a nominally 100% tin composition in the end terminations. As to resistor-type components such as those having raised upper surface portions (typically colored white) it was found that the problem could be alleviated by loading chips in the magazine so as to cause all of the chips to be oriented in the same way in the tubes, i.e., with the raised or colored portions consistently up or down. The remaining failure mode noted was found to be encountered with dipped chips, i.e., those in which the conductive end areas were formed by dipping the chips into conductive material. It was believed that the failures caused by such components was due to increased termination thickness and resultant "dog boning" wherein the conductive surface areas were raised such that a cross-sectional area of the chip appears like a dog bone with bulbous conductive areas at opposing end surfaces. This problem appeared to be alleviated by specifying as preferred components those wherein the conductive material is plated on to the chip.

Figure 18:
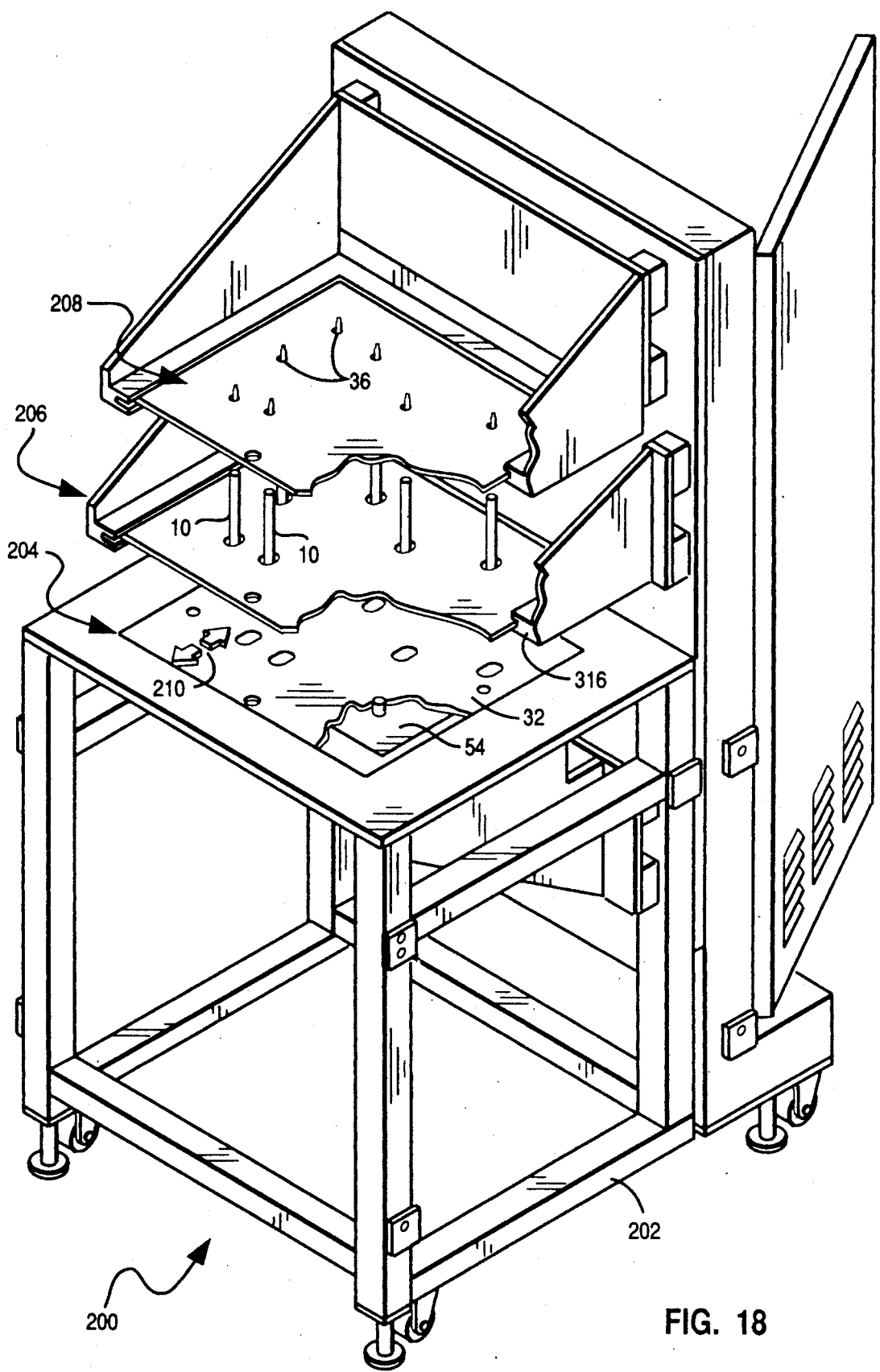
FIG. 18 is a simplified pictorial view of a simultaneous component placement machine carrying a plurality of the chip placement means on a load plate.

Referring now to FIG. 18, a placement machine 200 is shown employing a load plate assembly 206 carrying a plurality of chip placement means 10. The purpose of the machine 200 is to cause the simultaneous placement of a plurality of chips 18 on a board 226 (FIG. 20) in a preselected geometric pattern of chip sites in a manner to hereinafter be described.

First an overall description of the operation of the machine 200 will be provided followed by a more detailed description of the aspects thereof. The machine includes a frame 202 which in addition to supporting the load plate assembly 206, also supports a shuttle plate assembly 204 disposed therebelow and a vacuum plate assembly 208 disposed above the load plate assembly 206. As shown by the arrows 210 in FIG. 18, the shuttle plate 54, FIG. 19, of the shuttle plate assembly 204 is alternately urged in the directions of the arrows. A pair of apertures 51, 52 (FIG. 10) are provided in the shuttle plate for each chip assembly 10 with each such pair spaced proximally to its corresponding chip placement means 10. More particularly, the second such apertures 52 are each disposed in the shuttle plate 54 so as to each receive a corresponding projection means 50 from a corresponding slider 26, each projection means extending pendantly downwards into the second apertures 52. The first apertures 51, as shown in FIG. 10, are disposed proximally to the second apertures 52 whereby when the shuttle plate 54 is moved from the position of FIG. 10 to that of FIG. 11, these first apertures 51 are brought into vertical registry with a corresponding vacuum tube 36 and vacuum tube aperture 44, FIG. 3, in order to permit chip placement by extension of the vacuum tube 36 downwards to the board 226 (or board 16 as shown in FIG. 9).

Figure 19:
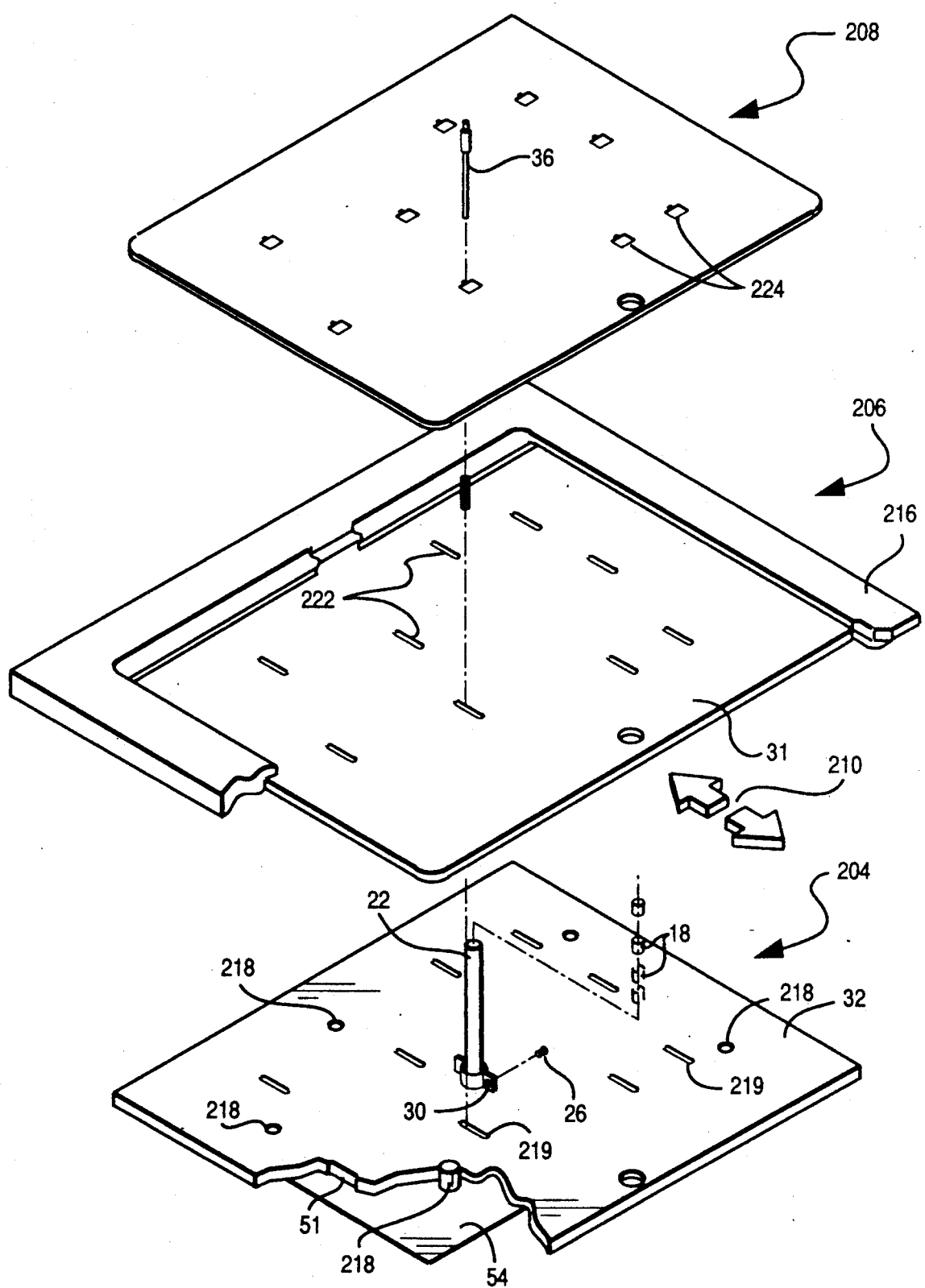
FIG. 19 is an exploded pictorial view, partly in section, depicting the various plates of the apparatus of FIG. 18 in greater detail.

It will be appreciated that the overall function of the shuttle plate 54 is not only to cause vertical alignment of these vacuum tube apertures 44 and corresponding vacuum tubes 36 and first apertures 51, but also to cause the stripping off of chips 18 and sequential placement thereof in vertical registry with the tube 36 in a manner shown by the sequence drawings FIGS. 10-12. It will be noted in FIG. 18 that the shuttle plate assembly 204, load plate assembly 206, and vacuum plate assembly 208 are disposed in vertical registry whereby the assemblies 206 and 208 may move vertically in a manner to be described with reference to FIGS. 20-25 during operation of the machine 200. The vacuum plate assembly 208 will be seen to carry a plurality of the vacuum tubes 36 in a geometric pattern identical to the plurality of chip placement means 10 disposed on and carried by the load plate assembly 206. In like manner, the aperture pairs 51-52 will be disposed as aforementioned in the plate assembly 204 in this identical geometric pattern. With reference to FIG. 19, the apertures 224 through which the vacuum tubes 36 extend are in an identical geometric pattern to the apertures 222 in the top load plate 31 (also seen in FIG. 10) of the load plate assembly 206 which is carried by the machine frame 216. With reference to the shuttle plate carrier 32, FIGS. 10, 18, 19, it will be held stable by the frame 202 relative to the load plate 31 and thus the shuttling motion will be imparted to the shuttle plate 54 relative to the shuttle plate carrier 32 and top load plate 31. A plurality of pins 218, FIGS. 10 and 19 are provided to the shuttle plate assembly 204 whereby the shuttle plate 54 is supported by the shuttle plate carrier 32. By means of slots in the shuttle plate 54 larger than the pins this permits the shuttling action of the shuttle plate 54 relative to the plate carrier 32 and load plate 31 in the direction of the arrows 210.

Figure 20A:
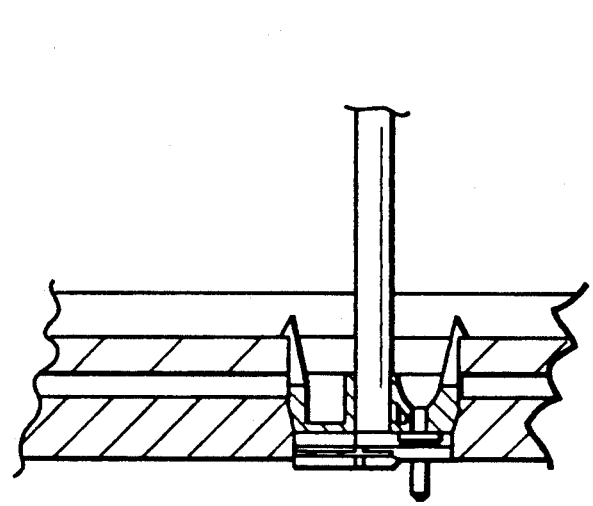
FIGS. 20-25 are simplified elevational views of a portion of the apparatus of FIG. 18 depicting the position of various plates and other components of the apparatus of FIG. 18 during an operation progressing from load, down, home, chip pickup, home, to chip placement positions, respectively.
Figure 20:
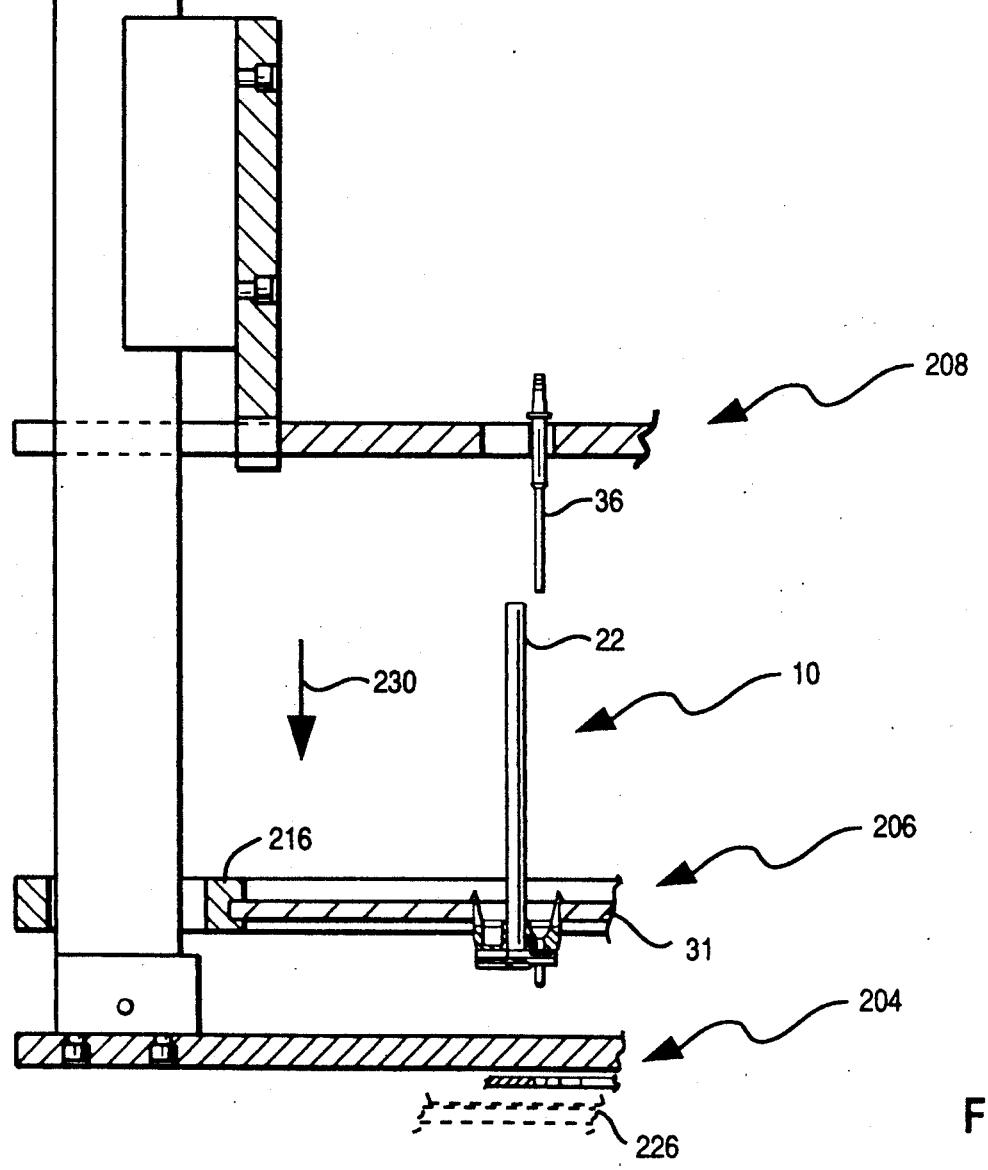

With a general understanding of the overall operation of the machine 20 now having been provided, an important feature of the invention may be understood. The top load plate 31 of the load plate assembly 206 is made in such a way (as, for example, by slidable engagement with the frame 216) whereby this load plate 31 may be readily disengaged and re-engaged with the machine 200. It is a feature of the invention to provide for a plurality of such load plates 31 which may be populated off line from the machine 200 with the plurality of chip placement means 10 in the predetermined geometric pattern in which chips are desirably to be placed on the board 226. When a board 226 is disposed as shown in FIG. 20 under the shuttle plate assembly 204 and the chip placement operation sequence performed by movement of the shuttle plate and vacuum tube as previously described, the vacuum tubes 36 will cause to be placed on the chip sites 14 of the given board 16, 226 a plurality of the chips in the desired geometric pattern. This may be followed by disposition of a next board to be populated under the shuttle plate assembly 204 in machine 200 wherein a plurality of next chips are again simultaneously placed on the next board. This sequence of operations continues until all of the chips in one or more of the magazines 22 are exhausted whereupon the entire load plate 31 may be removed from the machine 200 and a replacement load plate 31 slid into position whereupon the placement operation is resumed. Obviously the subsequent load plate 31 will have been populated with another plurality of the chip placement means 10 in the same geometric pattern. In this manner, with a plurality of pre-loaded load plates 31 off line ready to be installed in the placement machine 200, down time of the machine is minimized at the time when the chip supply needs to be replenished in the machine. Moreover, it will be further appreciated that the geometric pattern of chips to be placed on the board 226 is only a function of the geometric location of the apertures 222 in which the chip placement 10 are installed (and, of course, the corresponding apertures 224 in the vacuum assembly plate 208 and apertures in the shuttle plate carrier 32 and shuttle plate 54.

Accordingly when a next pass of boards 226 is desired to place a next set of chips simultaneously in a next geometric pattern, the machine 200 may quickly be retrofitted with a substitute vacuum plate assembly 208, load plate assembly 206 and shuttle plate assembly 204, each having appropriate apertures in the desired geometric pattern. In the alternative, it is contemplated by the invention to provide for a plurality of such placement machines 200 disposed in tandem each placing its own corresponding set of chips simultaneously in its corresponding geometric pattern before conveying the board 226 to an adjacent such placement machine 200 for subsequent placement of additional components simultaneously by that machine in the pre-selected geometric pattern determined by that machine's spatial positioning of its chip placement means 10 on its load plate 31.

With reference now to FIGS. 20-25, the sequence of vertical movements of the vacuum plate assembly 208 and load plate assembly 206 will now be described. In FIG. 20, the machine 200 is shown in a load configuration wherein the load plate 31 may be easily installed on and removed from the machine 200. Thus, in this configuration the vacuum assembly plate 208 is raised substantially above the load plate assembly 206 which, in turn, is raised above and disengaging from the shuttle plate assembly 204. It will be noted that for simplicity the plurality of chip placement means 10 carried on a given load plate 31 as shown in FIG. 18 has been replaced by the showing of a single such chip placement means 10 for clarity although it will be readily appreciated that the invention contemplates the load plate 31 carrying a plurality of such chip placement means 10. As aforesaid, the vacuum plate assembly 208 and load plate assembly 206 are mounted on the placement machine 200 so as to be vertically movable in any number of manners well known in the art.

Figures 21, 21A:
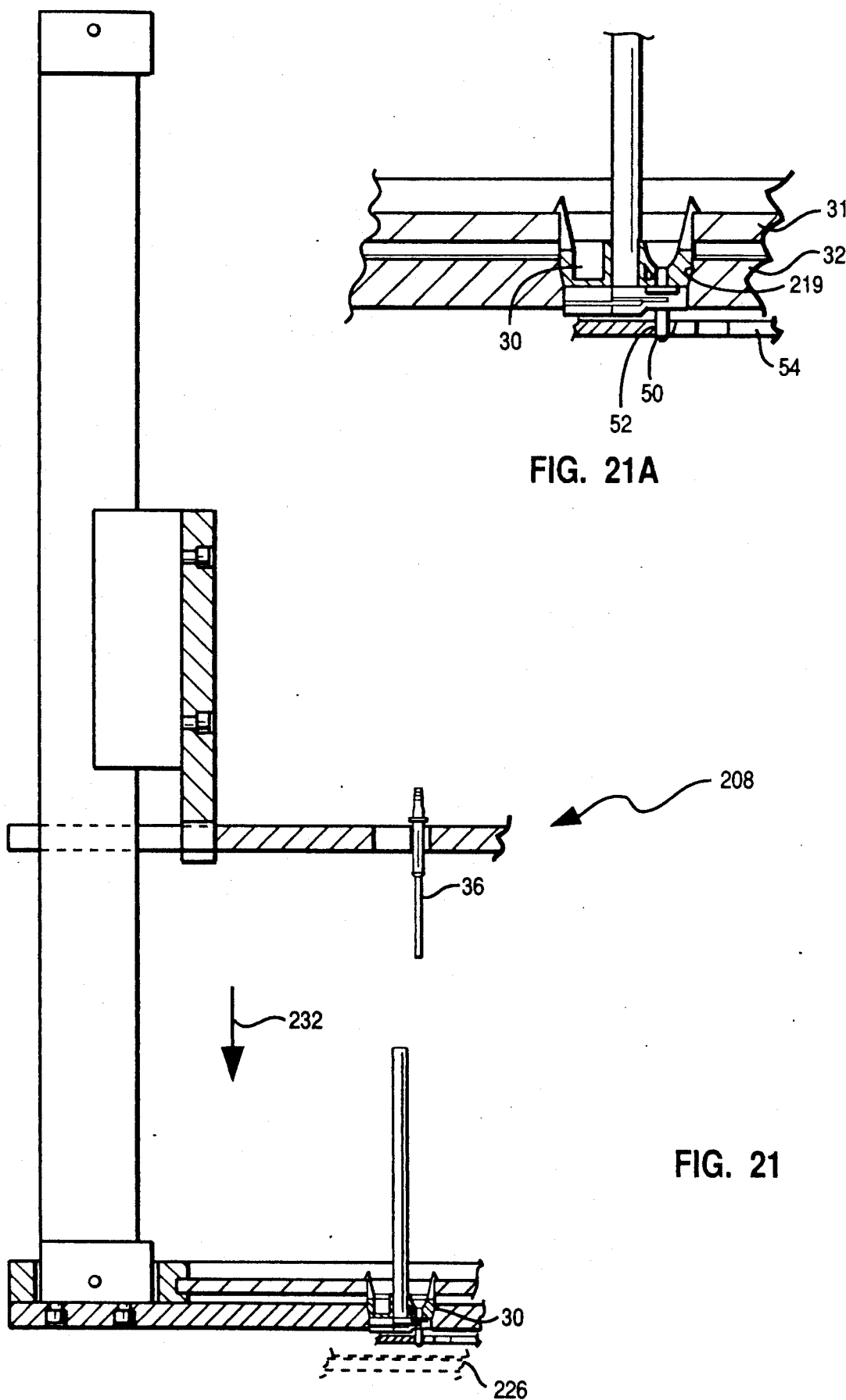
Figure 22A:
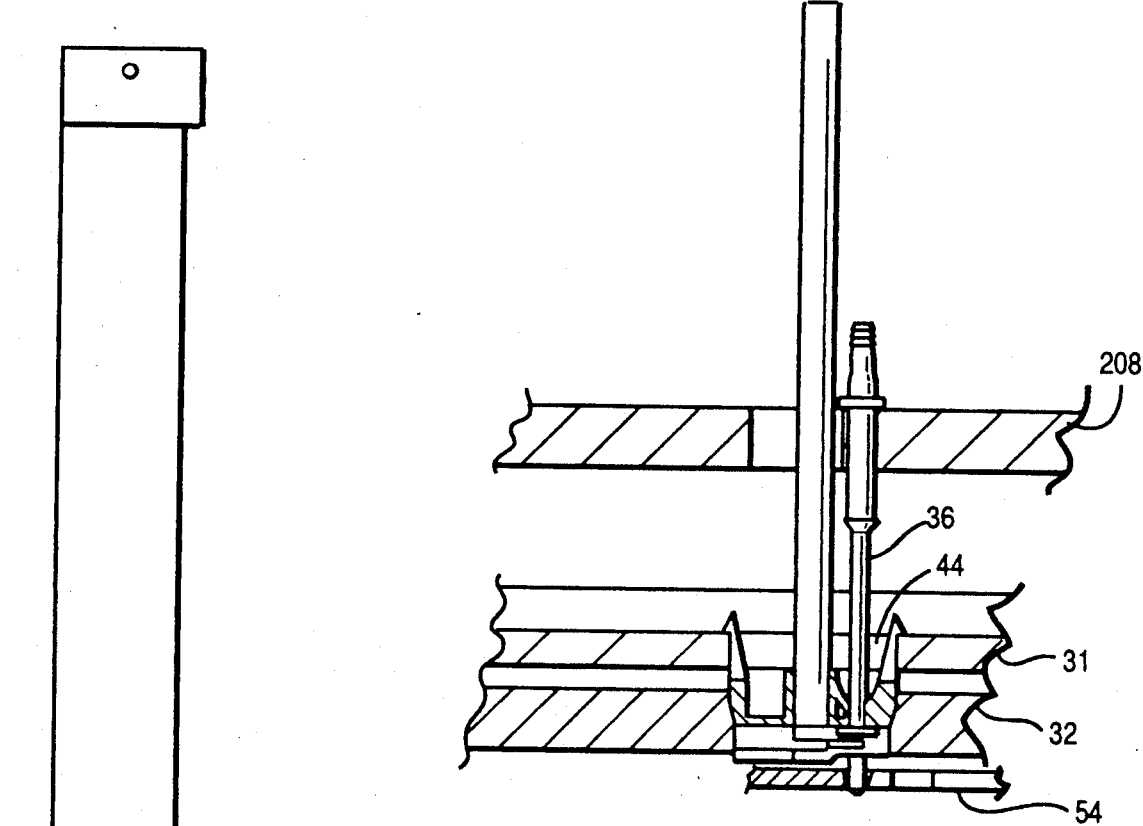
Figure 22:
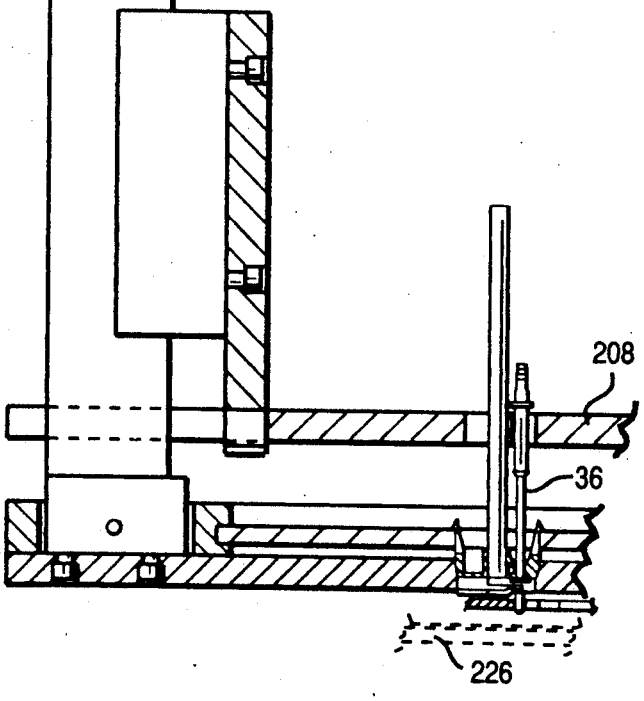

In the next sequence of operation of the machine 200, accordingly, the load plate assembly 206 is urged downwards in the direction shown by arrow 230, FIG. 20, by some appropriate means, not shown, into the position shown in FIG. 21. In this position, the block 30 of each chip placement means 10 extends through a mating aperture 219 in the shuttle plate carrier 32 whereby each projection 50 extends into a mating second aperture 52 in the shuttle plate 54 as shown in FIG. 21a. Next, the vacuum assembly plate 208 carrying the plurality of vacuum tubes 36 is urged downwards in the direction of arrow 232 as shown in FIG. 21 to the position shown in FIG. 22, FIG. 22a whereby each such vacuum tube 36 is disposed over its corresponding vacuum tube aperture 44 in each block 30.

Figure 23A:
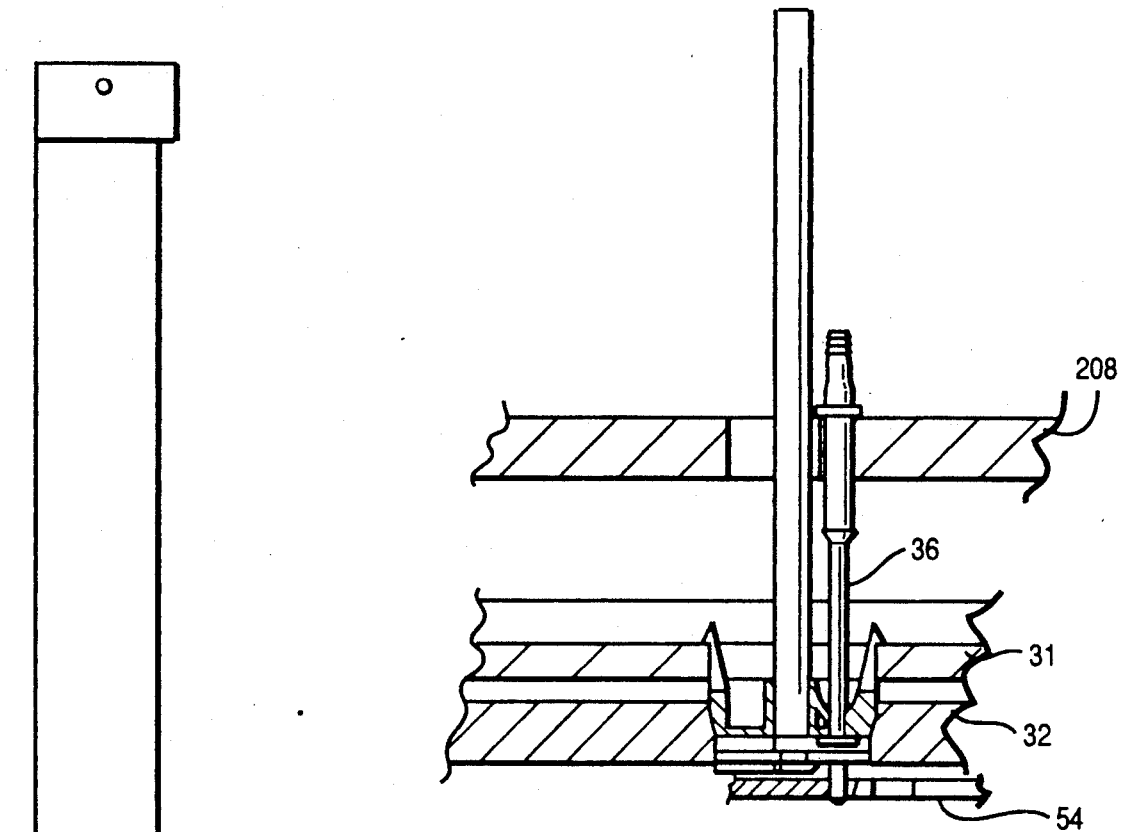
Figure 23:
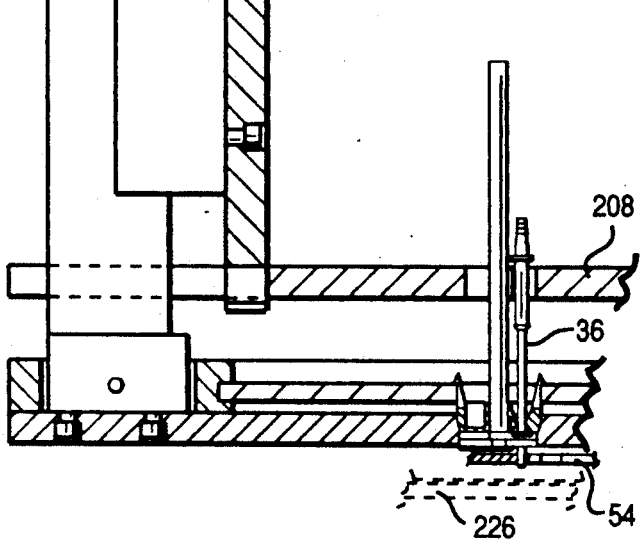
Figure 24A:
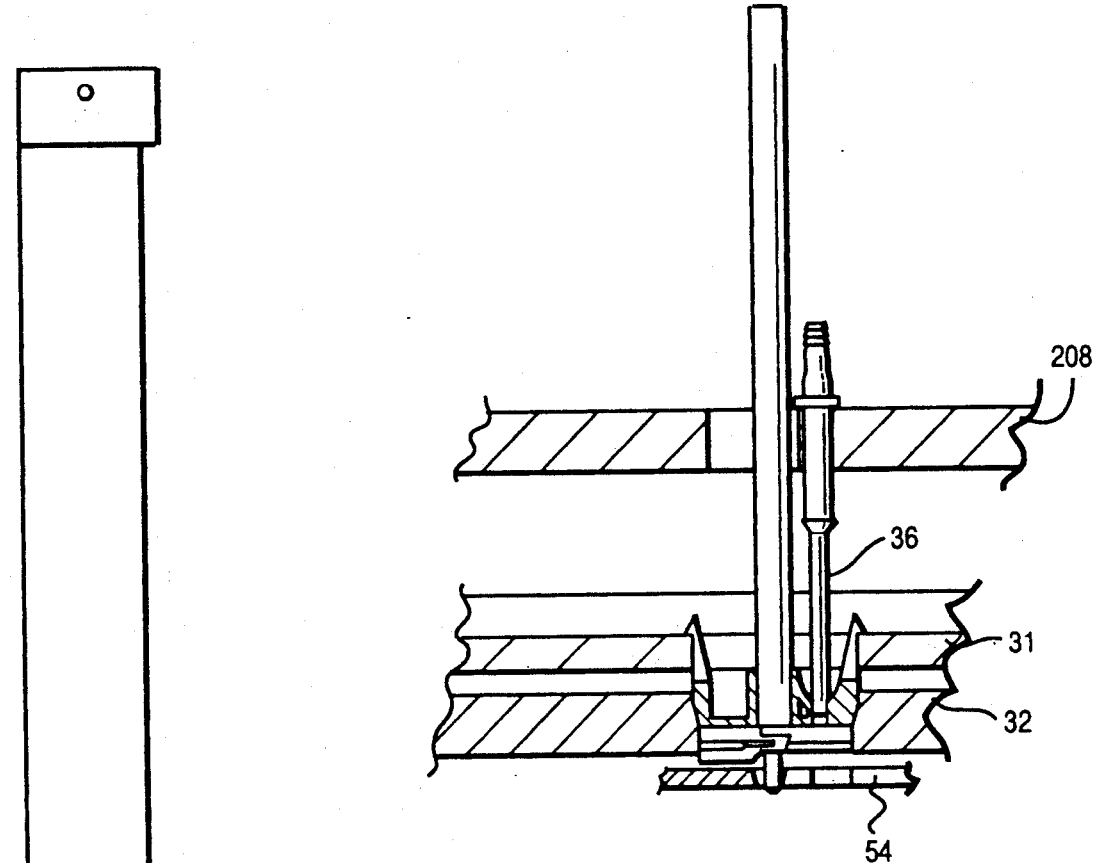
Figure 24:
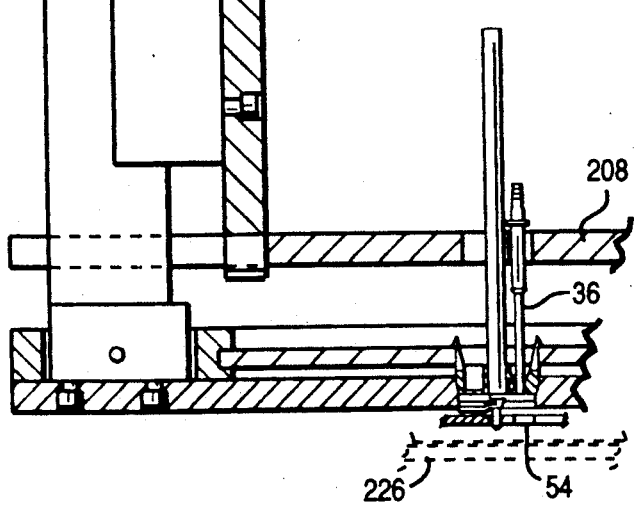
Figure 25A:
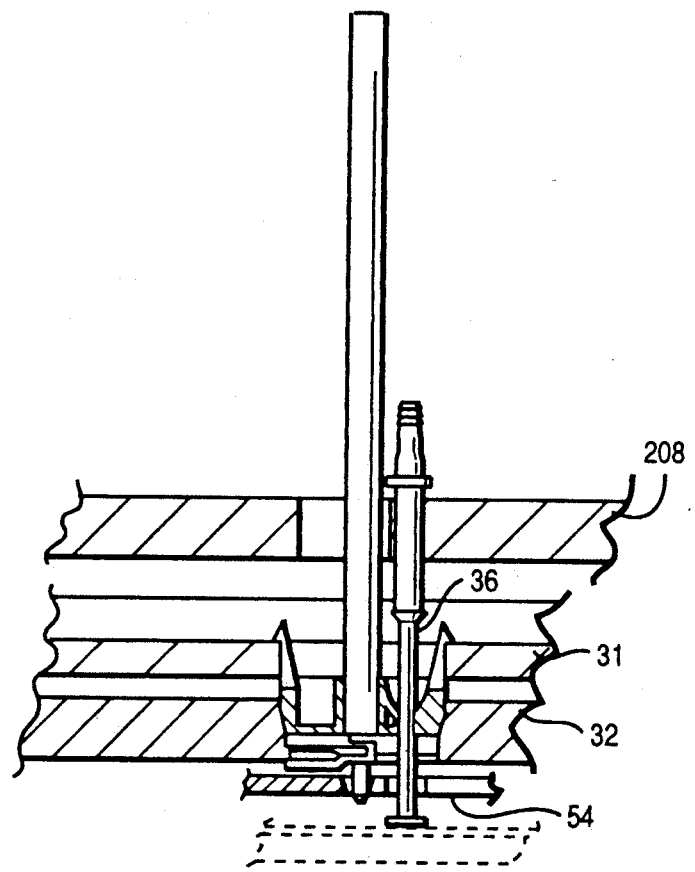
Figure 25:
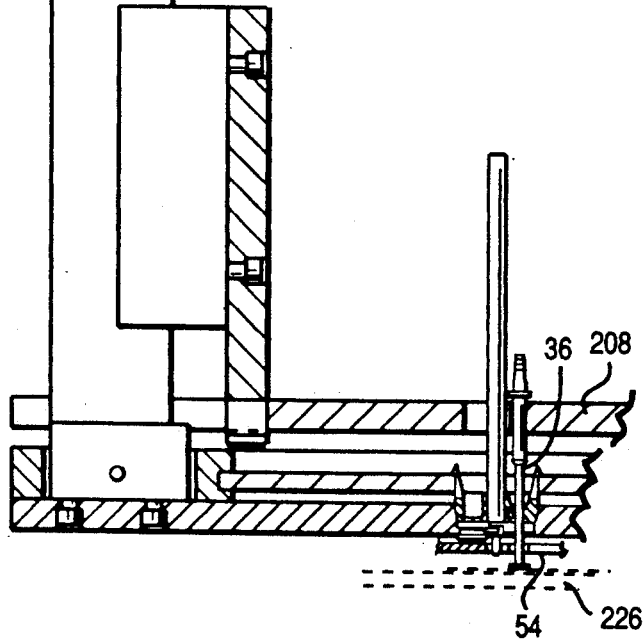

Next as shown in FIG. 23, the shuttle plate 54 is urged in a direction so as to cause each shuttle 26 to be in the chip pickup position shown in FIG. 23 and FIG. 11 in preparation for stripping a chip off of the stack. When the shuttle plate 54 is thence urged in the opposing direction, each chip is thereby in vertical registry with a corresponding vacuum tube aperture 44 in preparation for support and placement by its corresponding vacuum tube 36 as shown in FIG. 12. With each vacuum tube 36 disposed in its corresponding aperture 44 and upon vacuum being imparted to the tubes, the chips are thereby supported as shown in FIGS. 8 and 23 after which the shuttle plate returns to the position shown in FIG. 24 in preparation for chip placement. The vacuum tubes 36 are thence urged downwardly from the position shown in FIG. 24 to that of FIG. 25 so as to extend through the previously described apertures in the load plate 31, shuttle plate carrier 32, and shuttle plate 54 so as to effect simultaneous placement of the chips on the board 226 in the desired geometric pattern.

Whereas the embodiment of the invention depicted is adapted particularly well to surface mounted type leadless electronic components as well as orientation of the magazines generally normal to and above the circuit board for component placement on the upper surface thereof, the invention is not intended to be so limited.

Accordingly the invention may be adapted to positioning of various small components or articles of manufacture. Moreover the magazines need not be positioned normal to the board nor from a position thereabove. For example, in applications wherein it is desired to populate the underneath side of boards, the apparatus described herein may be inverted with minor modification such as the addition of means to continuously bias the chip stack upwardly.

While the invention has been shown and described with reference to particular embodiments thereof, it will be understood by those skilled in the art that the foregoing and other changes in form and details may be made therein without departing from the spirit and scope of the invention.

We claim:

1. Apparatus for use in simultaneous mounting of a plurality of leadless chips on a circuit board at sites defining a preselected geometric pattern comprising:
    a load plate releasably interconnectable to said apparatus; and
    a plurality of chip placement assemblies releasably and simultaneously carried on said plate arranged in said pattern; said placement assemblies each comprising
    support means for supporting a stack of said leadless chips adjacent said board, said stack defining a substantially longitudinal axis therethrough; and
    stripping means for urging a first leadless chip of said stack along a line substantially transverse to said stack from a first position within said stack and into a cavity aligning said chip in a second position opposing one of said sites and wherein said stripping means includes means for supporting said chip with a fluid pressure differential while maintaining said alignment by said cavity.

2. The apparatus of claim 1 wherein said support means includes
    a magazine for receiving said stack of chips therewithin; and
    a mounting block carrying said magazine and defining said cavity.

3. The apparatus of claim 2 wherein said plate defines a plurality of apertures extending therethrough arranged in said pattern; and wherein said each placement assembly further includes
    connector means on said mounting block for releasable interconnection of said block to said plate when said block is disposed at least partially within said plate in one of said apertures in said plate.

4. The apparatus of claim 1 wherein said stripping means includes:
    a first stripper surface for carrying and maintaining said chip at a fixed orientation with respect to said line during said urging from said first to said second positions.

5. The apparatus of claim 4 wherein said stripping means further includes:
    a second stripper surface for restraining said stack from movement along said axis during said urging of said chip.

6. The apparatus of claim 5 wherein said stripping means includes:
    a step surface intermediate said first and second stripper surfaces for engaging an edge of said chip during said urging of said chip from said first to said second position.

7. The apparatus of claim 2 wherein said mounting block internally defines:
    tapered surface means for adjusting orientation of said first chip relative to said line during said sliding.

8. The apparatus of claim 5 including:
    means for urging said stack in the direction of said axis until a second chip adjacent said first chip in said stack is moved into said first position.

9. The apparatus of claim 8 further including:
    retainer means for preventing movement of said second chip in the direction of said line during said urging of said first chip.

10. The apparatus of claim 9 wherein:

said first and second chips define respective first and second thicknesses;

said first stripper surface and said retainer means define a first distance therebetween; and said first distance is between said first thickness and the sum of said first thickness and said second thickness.

11. The apparatus of claim 10 wherein:

said first stripper surface and said second stripper surface define a second distance therebetween; and wherein said second distance is less than said first thickness of said first chip.

12. The apparatus of claim 1 further comprising a shuttle plate having a plurality of apertures extending therethrough; and wherein said stripping means is in sliding engagement with said support means and includes a projection means extending into a respective one of said apertures in said shuttle plate for urging said stripping means in opposing directions in response to motion of said shuttle plate.

13. The apparatus of claim 12 wherein said plurality of apertures in said shuttle plate define said geometric pattern of said placement assemblies.

14. The apparatus of claim 13 further including pin means engaging said shuttle plate for slidably supporting said shuttle plate relative to said load plate in vertical registry therewith.

15. The apparatus of claim 12 wherein said projection means is comprised of a material preselected to shear from said stripping means when force exerted by said shuttle plate against said projection means exceeds a preselected magnitude.

16. The apparatus of claim 1 further including a stack of leadless chips disposed in said support means.

17. The apparatus of claim 1 wherein each of said assemblies is releasable from and interconnectable to said load plate as an integral unit.

18. A method of positioning leadless chips, for use in simultaneous mounting of a plurality of said ships at circuit board sites, comprising:

providing a plurality of chip placement devices, each corresponding to the mounting location of said chips at said circuit board sites;

simultaneously disposing said leadless chips adjacent said board in a plurality of stacks each defining a longitudinal axis therethrough;

simultaneously urging a first leadless chip of each said stack along a line transverse to said stack from a first position within said stack and into a cavity aligning said chip in a second position opposing one of said sites; and simultaneously supporting said chip of each said stack with a fluid pressure differential while maintaining said alignment by said cavity.

19. The method of claim 18 wherein said urging occurs while maintaining a surface of said first chip in a plane intersecting said axis and containing said line.

20. The method of claim 19 further including the step of moving each said stack along a respective said axis until a second leadless chip of each said stack adjacent a corresponding said first chip in said each stack is moved into said first position.

21. The method of claim 20 further including repeating said urging step wherein said second chip becomes said first chip.

22. The method of claim 18 further including maintaining said first chip in said second position in response to a fluid pressure differential.

23. The method of claim 18 further including the step of:

adjusting orientation of said first chip relative to said line during said urging.

24. The method of claim 18 wherein said step of disposing said plurality of stacks of chips adjacent said board comprises:

releasably maintaining said chips at a location a predetermined distance from said board.

* * * * *

UNITED STATES PATENT AND TRADEMARK OFFICE
CERTIFICATE OF CORRECTION

PATENT NO. : 5,044,875

DATED : Sep. 3, 1991

INVENTOR(S) : Ronald E. Hunt and Verlon E. Whitehead

It is certified that error appears in the above-identified patent and that said Letters Patent is hereby corrected as shown below:

Col. 18, line 2, please delete "ships" and insert --chips--.

Signed and Sealed this

Sixteenth Day of February, 1993

Attest:

STEPHEN G. KUNIN

Attesting Officer

Acting Commissioner of Patents and Trademarks